US011832533B2

(12) United States Patent
Sims et al.

(10) Patent No.: US 11,832,533 B2
(45) Date of Patent: Nov. 28, 2023

(54) CONFORMAL DAMAGE-FREE ENCAPSULATION OF CHALCOGENIDE MATERIALS

(71) Applicant: Lam Research Corporation, Fremont, CA (US)

(72) Inventors: James Samuel Sims, Tigard, OR (US); Andrew John McKerrow, Lake Oswego, OR (US); Meihua Shen, Fremont, CA (US); Thorsten Lill, Kalaheo, HI (US); Shane Tang, Camas, WA (US); Kathryn Merced Kelchner, Point Charlotte, FL (US); John Hoang, Fremont, CA (US); Alexander Dulkin, Sunnyvale, CA (US); Danna Qian, San Jose, CA (US); Vikrant Rai, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/645,178

(22) Filed: Dec. 20, 2021

(65) Prior Publication Data
US 2022/0115592 A1  Apr. 14, 2022

Related U.S. Application Data

(62) Division of application No. 16/112,503, filed on Aug. 24, 2018, now Pat. No. 11,239,420.

(51) Int. Cl.
*H10N 70/00* (2023.01)
*H01L 21/67* (2006.01)
*H01L 21/02* (2006.01)
*C23C 16/34* (2006.01)
(Continued)

(52) U.S. Cl.
CPC .......... *H10N 70/011* (2023.02); *C23C 16/34* (2013.01); *C23C 16/4554* (2013.01);
(Continued)

(58) Field of Classification Search
CPC . H01L 45/141; H01L 21/0217; H01L 21/022; H01L 21/0234; H01L 21/02274;
(Continued)

(56) References Cited

U.S. PATENT DOCUMENTS 5,314,724 A    5/1994  Tsukune et al.
6,034,000 A *  3/2000  Heyder ............ H01L 21/67781
                                                    438/758
(Continued)

FOREIGN PATENT DOCUMENTS

CN    101981225 A    2/2011
CN    101997002 A    3/2011
(Continued)

OTHER PUBLICATIONS

Aboaf, J.A. (1969) "Some Properties of Vapor Deposited Silicon Nitride Films Obtained by the Reaction of SiBr4 and NH 3," Journal of the Electrochemical Society, 116(12):1736-1740.
(Continued)

*Primary Examiner* — Shahed Ahmed
*Assistant Examiner* — Khatib A Rahman
(74) *Attorney, Agent, or Firm* — Weaver Austin Villeneuve & Sampson LLP

(57) ABSTRACT

Methods and apparatuses for forming an encapsulation bilayer over a chalcogenide material on a semiconductor substrate are provided. Methods involve forming a bilayer including a barrier layer directly on chalcogenide material deposited using pulsed plasma plasma-enhanced chemical vapor deposition (PP-PECVD) and an encapsulation layer over the barrier layer deposited using plasma-enhanced atomic layer deposition (PEALD). In various embodiments, the barrier layer is formed using a halogen-free silicon precursor and the encapsulation layer deposited by PEALD (Continued)

is formed using a halogen-containing silicon precursor and a hydrogen-free nitrogen-containing reactant.

15 Claims, 8 Drawing Sheets

(51) Int. Cl.
| | |
|---|---|
| *C23C 16/509* | (2006.01) |
| *C23C 16/455* | (2006.01) |
| *H10N 50/01* | (2023.01) |
| *H10N 70/20* | (2023.01) |
| *H10N 50/00* | (2023.01) |

(52) U.S. Cl.
CPC .......... *C23C 16/509* (2013.01); *H01L 21/022* (2013.01); *H01L 21/0217* (2013.01); *H01L 21/0228* (2013.01); *H01L 21/0234* (2013.01); *H01L 21/02211* (2013.01); *H01L 21/02216* (2013.01); *H01L 21/02274* (2013.01); *H01L 21/67167* (2013.01); *H10N 50/00* (2023.02); *H10N 70/231* (2023.02); *H10N 70/826* (2023.02); *H10N 70/882* (2023.02)

(58) Field of Classification Search
CPC ... H01L 21/28556–28562; H01L 45/16; H01L 21/02211; H01L 21/02216; H01L 21/0228; H01L 21/67167; H01L 43/12; H01L 45/06; H01L 45/1233; H01L 21/02277; H01L 21/67161; H01L 21/67184; H01L 21/67207; H01L 45/144; H01L 45/167; H01L 45/1616; H01L 21/76846; H01L 21/02315; H01L 21/02532; H01L 21/02568; H01L 21/67017; C23C 16/4554; C23C 16/50–517; C23C 16/45536–45542; C23C 16/34; C23C 16/509; C23C 16/345; C23C 16/515; C23C 16/52; H10N 70/011; H10N 50/01; H10N 70/231; H10N 70/826; H10N 70/882; H10N 70/023; H10N 70/063; H10N 70/8828

See application file for complete search history.

(56) References Cited

U.S. PATENT DOCUMENTS

| | | | |
|---|---|---|---|
| 7,019,159 B2 | 3/2006 | Dussarrat et al. | |
| 7,163,860 B1 | 1/2007 | Kamal et al. | |
| 7,372,118 B2 | 5/2008 | Asao et al. | |
| 7,745,346 B2 | 6/2010 | Hausmann et al. | |
| 8,586,390 B2 | 11/2013 | Tomioka | |
| 9,023,737 B2 | 5/2015 | Beynet et al. | |
| 9,070,555 B2 | 6/2015 | Hausmann et al. | |
| 9,214,333 B1 | 12/2015 | Sims et al. | |
| 9,385,318 B1 | 7/2016 | Henri | |
| 9,601,693 B1 | 3/2017 | Henri et al. | |
| 9,865,815 B2 | 1/2018 | Hausmann | |
| 10,141,505 B2 | 11/2018 | Hausmann | |
| 10,157,736 B2 | 12/2018 | Van Schravendijk et al. | |
| 10,319,862 B2 | 6/2019 | Ridgeway et al. | |
| 10,454,029 B2 | 10/2019 | McKerrow et al. | |
| 10,566,186 B2 | 2/2020 | Van Schravendijk et al. | |
| 10,763,107 B2 | 9/2020 | Van Schravendijk et al. | |
| 11,239,420 B2 | 2/2022 | Sims et al. | |
| 2003/0203614 A1 | 10/2003 | Rajagopalan et al. | |
| 2005/0025885 A1 | 2/2005 | McSwiney et al. | |
| 2005/0170104 A1 | 8/2005 | Jung et al. | |
| 2005/0227017 A1 | 10/2005 | Senzaki et al. | |
| 2007/0054450 A1 | 3/2007 | Hong et al. | |
| 2007/0080381 A1 | 4/2007 | Chien et al. | |
| 2007/0238316 A1 | 10/2007 | Ohashi | |
| 2008/0224305 A1 | 9/2008 | Shah | |
| 2009/0163041 A1 | 6/2009 | Mungekar et al. | |
| 2009/0321708 A1 | 12/2009 | Rho et al. | |
| 2010/0099271 A1 | 4/2010 | Hausmann et al. | |
| 2010/0102407 A1 | 4/2010 | Kajiyama et al. | |
| 2010/0124618 A1 | 5/2010 | Kobayashi et al. | |
| 2010/0243980 A1 | 9/2010 | Fukumizu | |
| 2011/0183528 A1 | 7/2011 | Wang et al. | |
| 2011/0248233 A1 | 10/2011 | Pellizzer et al. | |
| 2012/0104347 A1 | 5/2012 | Quick | |
| 2012/0164846 A1 | 6/2012 | Ha et al. | |
| 2012/0196048 A1 | 8/2012 | Ueda | |
| 2014/0023794 A1 | 1/2014 | Mahajani et al. | |
| 2014/0030448 A1 | 1/2014 | Bowen et al. | |
| 2014/0045342 A1 | 2/2014 | Mallick et al. | |
| 2014/0113455 A1 | 4/2014 | Reimer et al. | |
| 2014/0273477 A1 | 9/2014 | Niskanen et al. | |
| 2014/0273528 A1 | 9/2014 | Niskanen et al. | |
| 2014/0273529 A1 | 9/2014 | Nguyen et al. | |
| 2014/0273530 A1 | 9/2014 | Nguyen et al. | |
| 2014/0356549 A1 | 12/2014 | Varadarajan | |
| 2015/0014681 A1 | 1/2015 | Yamazaki | |
| 2015/0137061 A1 | 5/2015 | Donghi et al. | |
| 2015/0179706 A1 | 6/2015 | Rocklein et al. | |
| 2015/0221865 A1 | 8/2015 | Tada et al. | |
| 2015/0243708 A1 | 8/2015 | Ravasio et al. | |
| 2015/0243883 A1 | 8/2015 | Swaminathan et al. | |
| 2015/0259791 A1 | 9/2015 | Hausmann et al. | |
| 2015/0287916 A1* | 10/2015 | Campbell | H01L 45/06 438/763 |
| 2016/0046501 A1 | 2/2016 | Kverel et al. | |
| 2016/0079054 A1 | 3/2016 | Chen et al. | |
| 2016/0079440 A1 | 3/2016 | Ellinger et al. | |
| 2016/0093484 A1 | 3/2016 | Marsh | |
| 2016/0148806 A1 | 5/2016 | Henri et al. | |
| 2016/0284567 A1 | 9/2016 | Reilly et al. | |
| 2016/0293398 A1 | 10/2016 | Danek et al. | |
| 2016/0293609 A1* | 10/2016 | Jha | H01L 21/02164 |
| 2017/0092857 A1 | 3/2017 | Hausmann | |
| 2017/0323785 A1 | 11/2017 | Singhal et al. | |
| 2017/0323803 A1 | 11/2017 | Van Schravendijk et al. | |
| 2018/0040485 A1 | 2/2018 | Rueckerl et al. | |
| 2018/0114903 A1 | 4/2018 | Hausmann | |
| 2018/0130701 A1 | 5/2018 | Chun et al. | |
| 2018/0138405 A1 | 5/2018 | McKerrow et al. | |
| 2018/0148833 A1 | 5/2018 | Chatterjee et al. | |
| 2018/0245215 A1 | 8/2018 | Lei et al. | |
| 2019/0013353 A1 | 1/2019 | Lee et al. | |
| 2019/0085451 A1 | 3/2019 | Lei et al. | |
| 2019/0148177 A1* | 5/2019 | Yin | H01L 21/67161 414/221 |
| 2019/0157078 A1 | 5/2019 | Van Schravendijk et al. | |
| 2019/0311894 A1 | 10/2019 | Girard et al. | |
| 2020/0066987 A1 | 2/2020 | Sims et al. | |
| 2020/0152452 A1 | 5/2020 | Van Schravendijk et al. | |

FOREIGN PATENT DOCUMENTS

| | | |
|---|---|---|
| CN | 103403847 A | 11/2013 |
| CN | 105448701 A | 3/2016 |
| CN | 106057637 A | 10/2016 |
| JP | 2005011904 A | 1/2005 |
| JP | 2005163084 A | 6/2005 |
| JP | 2007281181 A | 10/2007 |
| JP | 2010232214 A | 10/2010 |
| JP | 2014038968 A | 2/2014 |
| JP | 2014179607 A | 9/2014 |
| KR | 20150041122 A | 4/2015 |
| KR | 20150099451 A | 8/2015 |
| KR | 20160033057 A | 3/2016 |
| TW | 201439105 A | 10/2014 |
| TW | 201704517 A | 2/2017 |
| TW | 201715609 A | 5/2017 |
| WO | WO-2014030393 A1 | 2/2014 |

OTHER PUBLICATIONS

Chinese First Office Action dated Feb. 20, 2019 issued in Application No. CN 201710316752.2.
Chinese Second Office Action dated Sep. 27, 2019 issued in Application No. CN 201710316752.2.

(56) References Cited

OTHER PUBLICATIONS

Chinese Third Office Action dated Mar. 19, 2020 issued in Application No. CN 201710316752.2.
International Preliminary Report on Patentability dated Mar. 11, 2021 issued in Application No. PCT/US2019/047560.
International Preliminary Report on Patentability dated May 23, 2019 issued in Application No. PCT/US2017/060240.
International Search Report and Written Opinion dated Dec. 6, 2019 issued in Application No. PCT/US2019/047560.
International Search Report and Written Opinion dated Feb. 21, 2018 issued in Application No. PCT/US2017/060240.
Japanese First Office Action dated Dec. 1, 2020 issued in Application No. JP 2016-185454.
Korean First Office Action dated Mar. 24, 2021 issued in Application No. KR 10-2017-0056225.
Lin et al., (1998) "Silicon Nitride Films Deposited by Atmospheric Pressure Chemical Vapor Deposition," Materials Research Society Symposium Proceedings vol. 495, Chemical Aspects of Electronic Ceramics Processing, Symposium held Nov. 30-Dec. 4, 1997, Boston, Massachusetts, U.S.A., 8 pages.
Taiwanese First Office Action dated Mar. 25, 2020 issued in Application No. TW 105130541.
Taiwanese Second Office Action dated Dec. 22, 2020 issued in Application No. TW 105130541.
U.S. Final Office Action dated Apr. 20, 2018 issued in U.S. Appl. No. 15/349,753.
U.S. Final Office Action dated Feb. 21, 2018 issued in U.S. Appl. No. 15/279,310.
U.S. Final Office Action dated Jul. 30, 2020 issued in U.S. Appl. No. 16/112,503.
U.S. Final Office Action dated Jun. 25, 2021 issued in U.S. Appl. No. 16/112,503.
U.S. Final Office Action dated Oct. 19, 2017 issued in U.S. Appl. No. 15/279,314.
U.S. Notice of Allowance dated Apr. 28, 2020 issued in U.S. Appl. No. 16/740,128.
U.S. Notice of Allowance dated Aug. 15, 2018 issued in U.S. Appl. No. 15/279,310.
U.S. Notice of Allowance dated Jul. 26, 2018 issued in U.S. Appl. No. 15/829,702.
U.S. Notice of Allowance dated Jun. 17, 2019 issued in U.S. Appl. No. 15/349,753.
U.S. Notice of Allowance dated Oct. 4, 2021, in U.S. Appl. No. 16/112,503.
U.S. Notice of Allowance dated Oct. 9, 2019 issued in U.S. Appl. No. 16/179,809.
U.S. Notice of Allowance dated Sep. 1, 2017 issued in U.S. Appl. No. 15/272,222.
U.S. Notice of Allowance dated Sep. 19, 2016 issued in U.S. Appl. No. 14/935,317.
U.S. Office Action dated Apr. 18, 2016 issued in U.S. Appl. No. 14/935,317.
U.S. Office Action dated Apr. 7, 2017 issued in U.S. Appl. No. 15/279,314.
U.S. Office Action dated Dec. 21, 2020 issued in U.S. Appl. No. 16/112,503.
U.S. Office Action dated Jul. 3, 2017 issued in U.S. Appl. No. 15/279,310.
U.S. Office Action dated May 19, 2017 issued in U.S. Appl. No. 15/272,222.
U.S. Office Action dated Oct. 10, 2019 issued in U.S. Appl. No. 16/112,503.
U.S. Office Action dated Oct. 23, 2017 issued in U.S. Appl. No. 15/349,753.
U.S. Office Action dated Sep. 28, 2018 issued in U.S. Appl. No. 15/349,753.
Wikipedia, The Free Encyclopedia, Definition of "Silicon Nitride," Archived from Apr. 9, 2015, 1 page [Downloaded on Oct. 12, 2017 from https://web.archive.org/web/20150409055521/https://en.wikipedia.org/wiki/Silicon_nitride].
CN Office Action dated Oct. 8, 2022 in Application No. CN201780070122.X with English Translation.
KR Office Action dated Jul. 12, 2022 in Application No. KR20197016749 With English translation.
KR Office Action dated Apr. 25, 2022, in Application No. KR10-2021-0180835 with English translation.
KR Office Action dated Dec. 28, 2022, in Application No. KR10-2021-0180835 with English translation.
KR Office Action dated Jan. 26, 2022, in Application No. 10-2019-7016749 with English translation.
CN Office Action dated Mar. 15, 2023 in Application No. CN201780070122.X with English Translation.
KR Office Action dated Mar. 31, 2023, in Application No. KR10-2016-0122046 with English translation.
TW Office Action dated Apr. 10, 2023, in Application No. TW108130393 with English translation.

\* cited by examiner

CONFORMAL DAMAGE-FREE ENCAPSULATION OF CHALCOGENIDE MATERIALS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Semiconductor device fabrication involves formation of memory stacks, which are often sensitive to oxidation and moisture and may not withstand high temperature operations or exposure to energetic species. As a result, memory stacks are often encapsulated prior to subsequent processing. However, some methods of depositing encapsulation layers may damage components of the process chamber, or may damage substrate materials. Further, some techniques may not be capable of forming sufficiently thin and hermetic layers.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Provided herein are methods of processing semiconductor substrates. One aspect involves a method including: providing a substrate including one or more exposed layers of chalcogenide material; depositing a first silicon nitride layer by exposing the one or more exposed layers of chalcogenide material to a pulsed halogen-free plasma; and after depositing the first silicon nitride layer, depositing a second silicon nitride layer on the first silicon nitride layer by atomic layer deposition using alternating pulses of a halogen-containing silicon-containing precursor and a nitrogen-containing reactant.

In various embodiments, the first silicon nitride layer is deposited using pulsed plasma plasma-enhanced chemical vapor deposition.

In some embodiments, the pulse of nitrogen-containing reactant during deposition of the second silicon nitride layer includes one pulse of nitrogen gas without hydrogen gas and one pulse of hydrogen gas without nitrogen gas. In various embodiments, the nitrogen-containing reactant is pulsed during generation of a plasma. In some embodiments, the pulse of nitrogen-containing reactant during deposition of the second silicon nitride layer includes one pulse of nitrogen plasma without hydrogen and one pulse of hydrogen plasma without nitrogen.

In some embodiments, the first silicon nitride layer prevents damage of the one or more exposed layers of the chalcogenide material when the second silicon nitride layer is deposited over the one or more exposed layers of the chalcogenide material.

The first silicon nitride layer may be deposited to a thickness of between about 5 Å and about 10 Å on a sidewall of the one or more exposed layers of chalcogenide material.

In various embodiments, the pulsed halogen-free plasma is ignited in an environment including a silane precursor and ammonia. For example, the silane precursor may be introduced to the silane precursor and ammonia environment in a mixture including nitrogen. In some embodiments, a ratio of the silane precursor to nitrogen in the mixture is at least about 30:1. The ammonia may be introduced to the silane precursor and ammonia environment in a mixture including hydrogen. A ratio of the ammonia to hydrogen in the mixture may be at least about 30:1.

In various embodiments, the halogen-free plasma is pulsed at a duty cycle of between about 5% and about 20%.

In some embodiments, the halogen-free plasma is pulsed between 0 W and a plasma power per substrate of between about 150 W and about 250 W.

In some embodiments, the one or more exposed layers of chalcogenide material are part of an ovonic threshold switching device.

The one or more exposed layers of chalcogenide material may be part of a phase change device.

In various embodiments, the method also includes, after depositing the first silicon nitride layer and prior to depositing the second silicon nitride layer, exposing the first silicon nitride layer to a post-treatment plasma to densify the first silicon nitride layer.

In some embodiments, at least one of the first silicon nitride layer and the second silicon nitride layer is deposited at a substrate temperature of less than about 250° C.

The nitrogen-containing reactant may be hydrogen-free. In some embodiments, the halogen-containing silicon-containing precursor includes iodine, bromine, or combinations thereof.

In some embodiments, the method also includes prior to depositing the first silicon nitride layer, etching the substrate including the one or more exposed layers of chalcogenide material, whereby the etching and the depositing of the first silicon nitride layer is performed without breaking vacuum.

In some embodiments, the depositing of the first silicon nitride layer and the depositing of the second silicon nitride layer are performed without breaking vacuum.

Another aspect involves a method for processing substrates, the method including: providing a substrate including one or more exposed layers of chalcogenide material; forming an encapsulation bilayer including a first silicon nitride layer having a first density and a second silicon nitride layer having a second density over the chalcogenide material by: depositing the first silicon nitride layer having the first density directly on the one or more exposed layers of the chalcogenide material; and depositing the second silicon nitride layer having the second density over the first silicon nitride layer having the first density, whereby the first density is less than the second density, and the first silicon nitride layer is located between the one or more exposed layers of chalcogenide material and the second silicon nitride layer.

In some embodiments, the first silicon nitride layer prevents damage of the one or more exposed layers of the chalcogenide material when the second silicon nitride layer is deposited over the one or more exposed layers of the chalcogenide material.

In various embodiments, the first silicon nitride layer is deposited to a thickness of between about 5 Å and about 10 Å on a sidewall of the one or more exposed layers of chalcogenide material.

The first silicon nitride layer may be deposited using pulsed plasma plasma-enhanced chemical vapor deposition.

In some embodiments, the first silicon nitride layer is deposited by exposing the one or more exposed layers of chalcogenide material to a pulsed plasma. The pulsed plasma may be ignited in a halogen-free silane precursor and ammonia environment.

In some embodiments, the first density is less than about 2.5 g/cm$^3$.

In some embodiments, second density is greater than about 2.6 g/cm$^3$.

In various embodiments the method also includes, after depositing the first silicon nitride layer and prior to depositing the second silicon nitride layer, exposing the first silicon nitride layer to a post-treatment plasma to densify the first silicon nitride layer to a density between the first density and the second density.

In some embodiments, the exposing of the first silicon nitride layer to the post-treatment plasma includes igniting the post-treatment plasma in presence of nitrogen and helium for a duration between about 30 seconds and about 60 seconds.

The post-treatment plasma may be ignited at a plasma power greater than plasma power used to deposit the first silicon nitride layer.

The post-treatment plasma may be ignited in a chamber having a chamber pressure less than the chamber pressure for depositing the first silicon nitride layer.

In some embodiments, the second silicon nitride layer is deposited using one or more cycles, each cycle including a pulse of a silicon-containing precursor, a pulse of nitrogen plasma without hydrogen, and a pulse of hydrogen plasma without nitrogen.

In some embodiments, the method also includes prior to depositing the first silicon nitride layer, etching the substrate including the one or more exposed layers of chalcogenide material, whereby the etching and the depositing of the first silicon nitride layer is performed without breaking vacuum.

In some embodiments, the depositing of the first silicon nitride layer and the depositing of the second silicon nitride layer are performed without breaking vacuum.

Another aspect involves a method for processing substrates, the method including: etching a substrate including one or more exposed layers of chalcogenide material; and after etching the substrate, forming an encapsulation bilayer over the one or more exposed layers of chalcogenide material without breaking vacuum.

The method may also include cleaning the substrate between the etching and the forming of the encapsulation bilayer.

In some embodiments, the cleaning, etching, and forming of the encapsulation bilayer are performed in the same apparatus.

In some embodiments, the encapsulation bilayer is formed at a chamber pressure between about 7 Torr and about 10 Torr.

For any of the embodiments described above, the encapsulation bilayer may be formed at a substrate temperature of less than 250° C.

In some embodiments, the substrate is provided to a process chamber having a chamber pressure of between about 7 Torr and about 10 Torr.

Another aspect involves an apparatus for processing substrates, the apparatus including: an etching module for etching a semiconductor substrate having one or more layers of chalcogenide materials to form a pattern of chalcogenide materials in stacks on the semiconductor substrate; a deposition module for depositing encapsulation bilayer on the semiconductor substrate using pulsed plasma plasma-enhanced chemical vapor deposition and plasma-enhanced atomic layer deposition; and a wafer transfer tool for transferring the semiconductor substrate between the etching module and the deposition module without breaking vacuum.

The apparatus may also include a cleaning module for cleaning a semiconductor substrate. In some embodiments, the apparatus also includes a mini-transfer station between the etching module and the deposition module. In some embodiments, etching module is configured to be at a different pressure than pressure of the deposition module.

Another aspect involves a memory device including: a memory stack including a chalcogenide material; and a first silicon nitride layer deposited over the memory stack and encapsulating the chalcogenide material, the first silicon nitride layer deposited by exposure to pulses of a plasma ignited in a halogen-free silane and a nitrogen-containing environment; and a second silicon nitride layer deposited over the first silicon nitride layer, the second silicon nitride layer deposited by alternating exposures of a halogen-containing silicon precursor and a second reactant using atomic layer deposition.

Another aspect involves a memory device including: a memory stack including a chalcogenide material; and a first silicon nitride layer deposited over the memory stack to a thickness between about 5 Å and about 10 Å on a sidewall of the memory stack and encapsulating the chalcogenide material, the first silicon nitride layer having a first density; and a second silicon nitride layer deposited over the first silicon nitride layer, the second silicon nitride layer having a second density, the second density being greater than the first density.

In some embodiments, the chalcogenide material is any one of sulfur, selenium, tellurium, and combinations thereof. In some embodiments, the first silicon nitride layer is deposited by pulsed plasma plasma-enhanced chemical vapor deposition. In some embodiments, the second silicon nitride layer is deposited by plasma enhanced atomic layer deposition.

These and other aspects are described further below with reference to the drawings.

DETAILED DESCRIPTION

Figure 1:
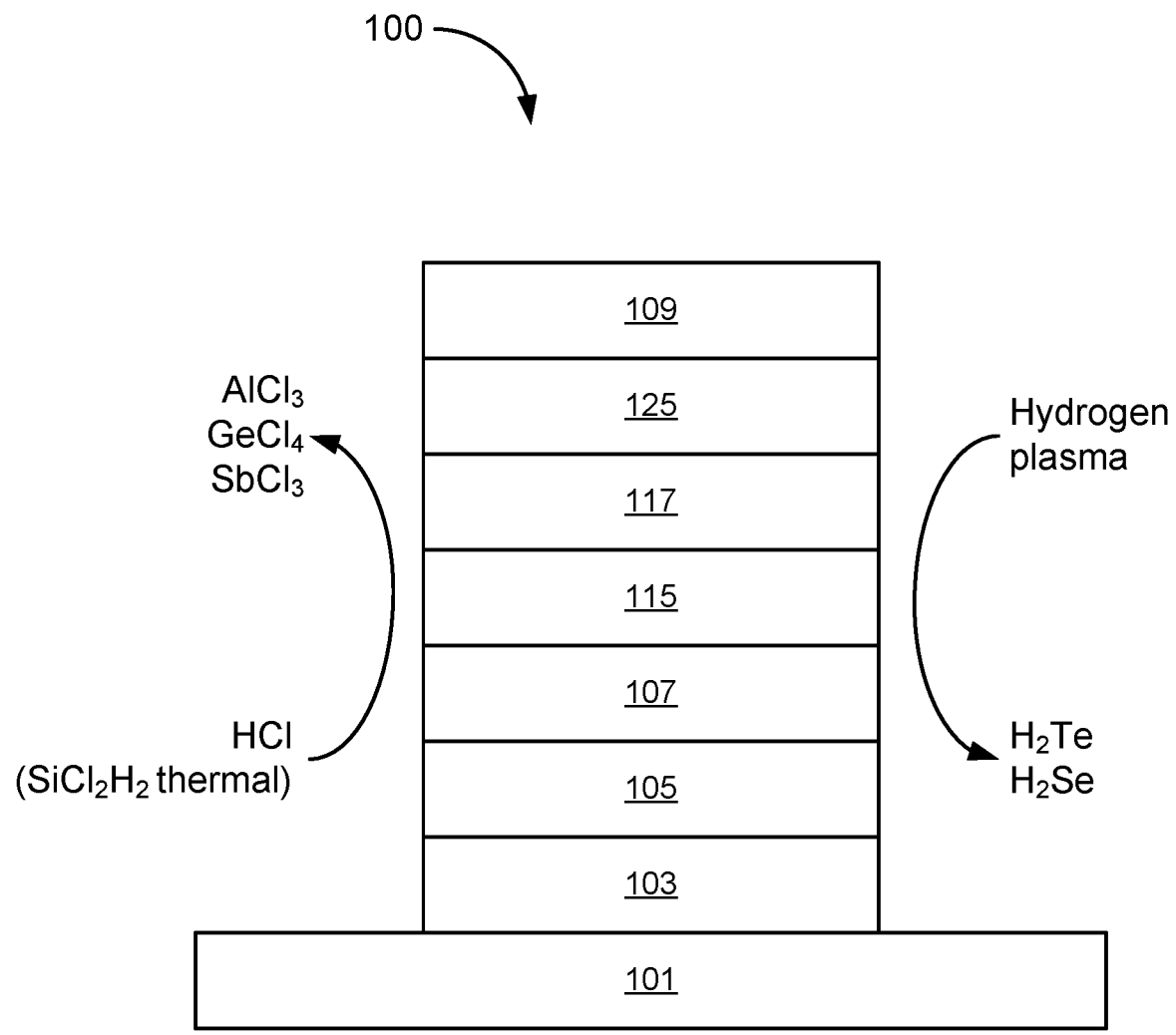
FIG. 1 is a schematic illustration of an example substrate.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes often involve deposition of silicon nitride material. In one example, silicon nitride may be used in semiconductor device fabrication as diffusion barriers, gate insulators, sidewall spacers, and encapsulation layers. Conformal silicon nitride layers may also be used in other applications. For example, silicon nitride may be used during fabrication of memory structures. Some memory structures include metal oxide materials used for bit storage. However, as advanced memory structures are developed to accommodate smaller device sizes and improve efficiency, new challenges arise. Advanced memory architectures such as magnetoresistive random-access memory and phase change random-access memory (PCRAM) rely on new materials (other than metal oxides) for bit storage. In some memory devices, an ovonic threshold switching (OTS) chalcogenide is present on the stack. The OTS chalcogenide may be sensitive to various gases and plasmas. In the case of PCRAM for example, the phase of a metal chalcogenide determines the bit state. Some example chalcogenides include sulfur (S), selenium (Se), and tellurium (Te). These new materials are air and moisture sensitive and may require encapsulation layers. When combined with appropriate metalloid ions such as germanium (Ge), antimony (Sb), etc., these chalcogenides form a phase change layer. In some cases, the memory device includes a germanium antimony tellurium (GST) material. If damaged, the phase change layer may not change phases. The phase change layer may also be sensitive to light. To prevent any damage to the phase change layer, a conformal silicon nitride memory encapsulation layer may be deposited over the phase change layer. The memory encapsulation layer has little to no contamination of other compounds and is deposited at low temperatures to avoid damaging the device. Effective encapsulation of phase change memory structures involves formation of high conformality, high density silicon nitride deposited at low temperature such that the deposited silicon nitride film protects the sensitive chalcogenide materials from attack by moisture and/or plasma etch chemistry. Additionally, the encapsulation deposition process and the encapsulation layer itself cannot react with the chalcogenide material or create volatile byproducts or cause compositional changes to the underlying material. An etched and cleaned chalcogenide material is also sensitive to oxygen, as oxidized chalcogenide material may lose its properties to be used as an effective PCRAM.

While halide-based atomic layer deposition is sufficiently reactive to form highly conformal silicon nitride at low temperatures, such as less than about 250° C., without forming volatile chalcogenide hydrides on OTS materials, the halide-based deposition may react with GST chalcogenide material to form a passivation layer, thereby degrading some GST chalcogenide material.

FIG. 1 depicts a substrate 100 including an oxide layer 101. The substrate 100 also includes a tungsten layer 103, carbon layer 105, chalcogenide layer 107, second carbon layer 115, second chalcogenide layer 117, third carbon layer 125, and nitride layer 109.

In some fabrication processes, after etching and cleaning processes of substrate 100, a silicon nitride encapsulation layer (not shown) may be deposited by plasma-enhanced atomic layer deposition over substrate 100. However, in some initial stages of film growth, exposed surfaces of tungsten layer 103, carbon layer 105, chalcogenide layer 107, second carbon layer 115, and second chalcogenide layer 117 may be damaged. For example, for 20 cycles of silicon nitride deposition, 5 Å of film may be deposited while plasma is on for about 60 seconds in each cycle, resulting in 20 minutes of exposure to plasma. In some cases, damaged chalcogenide surfaces are more sensitive to subsequent wet etching. While some barrier films may be used to suppress damage (such as 40 Å silicon nitride films), 30 Å films may result in damage after cleaning. It is believed that fluorine-containing etch chemistries both etches the film thickness and creates more porosity with hydrogen removal, resulting in increased likelihood of damage to the chalcogenide.

As shown in FIG. 1, if a chlorine-containing silicon precursor is used to deposit an encapsulation layer over the substrate, chlorine and/or hydrogen radicals generated when the plasma is ignited with the second reactant for the duration sufficient to deposit an encapsulation layer having a desired thickness may result in formation of hydrogen chloride such that chlorine may react with aluminum, germanium, or antimony, or other chamber material metals including iron or copper. These materials (e.g., aluminum chloride ($AlCl_3$), germanium(IV) chloride ($GeCl_4$), or antimony trichloride ($SbCl_3$)) may generate an evaporative layer, which form volatile metal salts. These materials have a low boiling point; for example, the boiling point of $AlCl_3$ is 120° C., the boiling point of $GeCl_4$ is 87° C., and the boiling point of $SbCl_3$ is 200° C. These volatile metal salts may thereby redeposit onto other layers of the substrate resulting in defects and performance issues. Thus, chlorine precursors suffer from the general issues of metal contamination in the films due to chamber etching which produces volatile metal chlorides (Al, Fe, and Cu).

Similarly, a plasma generated from a nitrogen-containing reactant such as ammonia may form free hydrogen ions, radicals, and other plasma species that may also etch the chalcogenide. For example, a hydrogen plasma may react with tellurium or selenium to form hydrogen telluride ($H_2Te$) and hydrogen selenide ($H_2Se$) respectively, thereby removing material from the stack and resulting in performance issues and defects. These materials have a low boiling point; for example, $H_2Te$ has a boiling point of −2° C., and $H_2Se$ has a boiling point of −41° C. Generation of such material from exposure to hydrogen plasma may thereby etch the stack. Accordingly, some chlorine- and hydrogen-free processes (e.g. using an $N_2$ plasma) do not generate a conformal film and may not be effective as barriers.

In some embodiments, an iodine-containing silane or a bromine-containing silane is reacted with nitrogen gas in a plasma-enhanced atomic layer deposition process (PEALD) to form high conformality silicon nitride at low temperatures without causing formation of volatile hydrides. However, while such silicon nitride encapsulation layers may be deposited at a low temperature (such as less than about 250° C.) with extremely high step coverage (greater than about 95%), without forming volatile byproducts with the chalcogenide, there may still be some reactions between the reactants and a more-sensitive GST phase material.

Provided herein are methods of forming a multi-layer encapsulation layer including a barrier layer to prevent chalcogenide material from reacting with halogen-containing silicon precursors used for depositing a silicon nitride layer deposited conformally. For example, the barrier layer prevents diiodosilane from reacting with chalcogenide material. In certain disclosed embodiments, the barrier layer is thin enough to act as a barrier to prevent a reaction between the halogen-containing silicon precursor and a chalcogenide material while silicon nitride material deposited by PEALD over the barrier layer provides sufficient hermeticity, step coverage, and quality for effectively encapsulating the chalcogenide material.

In various embodiments, an encapsulation bilayer is deposited. The bilayer includes a barrier layer in direct contact with chalcogenide material thereby separating the chalcogenide material from a conformally deposited silicon nitride material. While a bilayer may refer to two layers of material, it will be understood that more than two layers may also be deposited. The barrier layer described herein is deposited by pulsed plasma plasma-enhanced chemical vapor deposition (PP-PECVD). In various embodiments, the rest of the encapsulation layer is deposited by PEALD after depositing the barrier layer. In various embodiments, the ratio of thickness of the PP-PECVD layer to the thickness of the PEALD layer is between about 1:5 and about 1:10.

Certain disclosed embodiments are performed at a temperature less than a temperature at which chalcogenide material of a substrate being processes may be degraded. For example, in some embodiments, certain disclosed embodiments are performed at a substrate temperature less than about 300° C., or less than about 250° C. It will be understood that substrate temperature as described herein refers to the temperature at which a pedestal or substrate support or substrate holder holding a semiconductor substrate being processed is set. In some embodiments, operating at a certain substrate temperature involves performing a "temperature soak" prior to processing. During a "temperature soak," the substrate is heated to the process temperature upon which the substrate will be subject to various operations as described herein. For example, the methods disclosed may be performed at a substrate temperature less than about 300° C., such as about 250° C. or about 200° C., or between about 200° C. and about 250° C., or less than about 200° C., or as low as about 150° C., or as low as about 100° C. Thus, in some embodiments, the substrate is exposed to a temperature soak such that a pedestal holding the substrate in a process chamber may be set to a temperature of, for example, about 250° C. to heat the substrate to the process temperature and stabilize the temperature prior to processing.

Certain disclosed embodiments are suitable for forming effective encapsulation bilayers for both OTS and GST chalcogenide stacks without damaging the exposed chalcogenide material in the OTS and/or GST chalcogenide stack (such as without forming volatile byproducts with the chalcogenide), while maintaining a high step coverage of at least about 90%, and density of at least about 2.4 g/cm$^3$ for the PP-PECVD film and at least about 2.75 g/cm$^3$ for the PEALD layer.

In various embodiments, the bilayer is conformal. Conformality of films may be measured by the step coverage. "Step coverage" as used herein is calculated by dividing the average thickness of the deposited film on the sidewall by the average thickness of the deposited film at the top of the feature and multiplying it by 100 to obtain a percentage.

While the PP-PECVD layer itself, or the PEALD layer itself, may not necessarily be conformal, the bilayer including both layers may be conformal. It will also be understood that the PEALD layer itself may also be conformal, but if deposited alone without a PP-PECVD barrier layer, could result in reaction or degradation of the chalcogenide material at the chalcogenide-encapsulation layer interface.

In some embodiments, the PP-PECVD layer has some conformality, such as having a step coverage of at least about 50%. In some embodiments, the PEALD layer is deposited conformally, such that the step coverage is at least about 70% or at least about 90% or at least about 95%. An encapsulation bilayer including both a barrier layer and a PEALD silicon nitride layer may achieve step coverage greater than about 70%, or greater than about 90%, or between about 70% and about 90%.

In some embodiments, the deposited PP-PECVD or the PEALD layer or both layers are subject to post-treatment to improve conformality of the bilayer. Post-treatment processing operations include periodic exposure to inert gas and igniting a plasma during exposure to inert gas. For example, in some embodiments, after an encapsulation layer is deposited, the encapsulation layer may be exposed to an inert gas plasma (such as, but not limited to, argon, helium, nitrogen, and combinations thereof) for a duration between about 10 seconds and about 50 seconds. In various embodiments, encapsulation layers may be deposited by cycling between (1) PP-PECVD deposition and (2) exposures to inert gas and plasma.

While examples described herein involve deposition of silicon nitride encapsulation layers, it will be understood that in some embodiments, other materials may be deposited for the barrier layer and the PEALD layer. For example, encapsulation bilayers described herein may include Group IV element nitrides or carbides, any of which may be doped (such as with oxygen) or undoped. In various embodiments, the encapsulation layer may be any of the following chemistries or any of their combinations: silicon nitride (SiN), silicon carbide (SiC), oxygen-doped silicon carbide (SiCO), germanium nitride (GeN), germanium carbide (GeC), and oxygen-doped germanium carbide (GeCO). The effectiveness of encapsulation bilayers that include germanium are particularly surprising because germanium is a semiconductor, and is typically deposited using germane (GeH$_4$), which can cause a formation of a hydrogen-rich film. A hydrogen-rich encapsulation layer can have low resistivity and short the device. Additionally, the ratio of germanium to other elements in a GST layer contributes to the effectiveness and repeatability of a phrase change layer; it is particularly surprising that a germanium-containing encapsulation layer, which could potentially be a source of excess germanium that affects the GST layer composition, is capable of being used as an encapsulation layer without adverse effects.

Disclosed embodiments may be suitable for depositing encapsulation layers to a variety of thicknesses. In various embodiments, the PP-PECVD layer may be deposited to a thickness between about 1 Å and about 30 Å. It was particularly surprising that PP-PECVD layers having a thickness of only 3 Å were very effective as a barrier. In various embodiments, the PEALD layer may be deposited to a thickness between about 10 Å and about 100 Å. For example, an encapsulation layer deposited over an MRAM stack may have a thickness between about 150 Å and about 300 Å. A further example encapsulation layer deposited over a PCRAM stack may be about 50 Å in thickness. Thicker films may be deposited for either PP-PECVD layers, PEALD layers, or both. However, at certain thicknesses, the stack will be too thick to deposit between the devices in some advanced memory arrays. The thicknesses of the films will depend on the particular application for using the encapsulation layer. In various embodiments, increasing thickness of the layer increases the effectiveness of the barrier in properties such as preventing moisture from contacting underlying memory device material, but effectiveness of properties is weighed against the increasingly smaller devices and smaller critical dimensions between memory stacks.

Figure 2A:
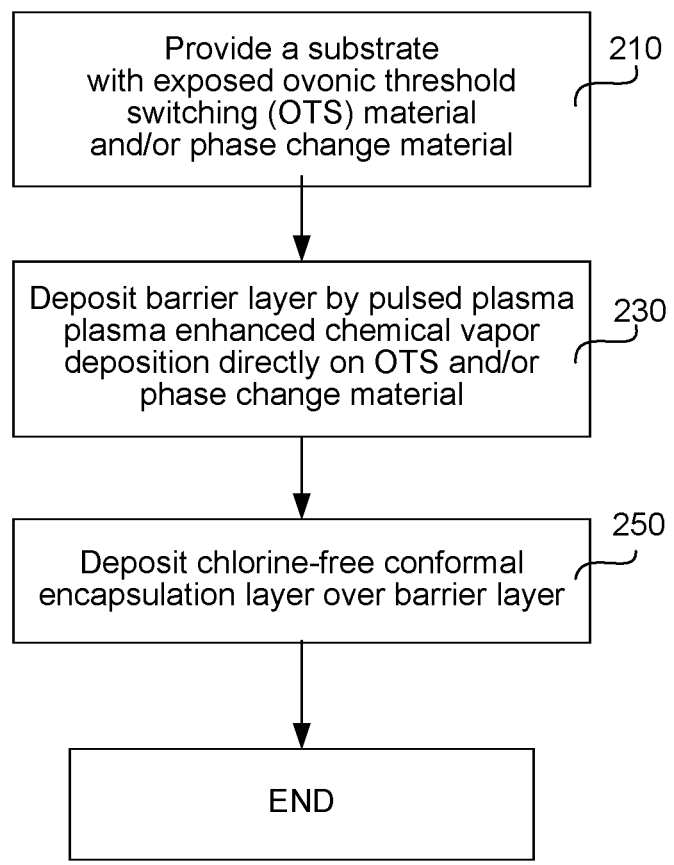
FIGS. 2A-2C are process flow diagrams depicting operations for example methods performed in accordance with certain disclosed embodiments.

FIG. 2A provides a process flow diagram showing operations of a method performed in accordance to certain disclosed embodiments. Operations in FIG. 2A may be performed at a temperature less than about 300° C. or less than about 250° C. or less than about 150° C.

During operations 230 and 250 of FIG. 2A, an inert gas may be flowed. In various embodiments, the inert gas is used as a carrier gas. Example carrier gases include argon, helium, and neon. In some embodiments, a hydrogen-containing carrier gas may be used. In some embodiments, a hydrogen-containing carrier gas may not be used so as to reduce the incorporation of hydrogen in the bilayer. In some embodiments, the carrier gas is used as a purge gas in some operations. In some embodiments, the carrier gas is diverted. The inert gas may be provided to assist with pressure and/or temperature control of the process chamber, evaporation of a liquid reactant, more rapid delivery of the reactant and/or as a sweep gas for removing process gases from the process chamber and/or process chamber plumbing.

In operation 210, a substrate is provided to a process chamber. Example process chambers are further described below with respect to FIGS. 4 and 5. The substrate provided may be a silicon wafer, e.g., a 200-mm wafer, a 300-mm wafer, or a 450-mm wafer, including wafers having one or more layers of material, such as dielectric, conducting, or semi-conducting material deposited thereon. Non-limiting examples of under-layers include dielectric layers and conducting layers, e.g., silicon oxides, silicon nitrides, silicon carbides, metal oxides, metal nitrides, metal carbides, and metal layers.

The substrate includes exposed ovonic threshold switching (OTS) material, or phase change material, or both. The substrate includes an exposed chalcogenide material. For example, in some embodiments, the substrate includes a stack of films, some of which are chalcogenide material, with exposed surfaces of the substrate including the chalcogenide material. Chalcogenide material may include sulfur, selenium, and tellurium. In various embodiments, the substrate includes OTS material and/or phase change material, which may include any one or more of the following elements: arsenic, germanium, antimony, tellurium, and selenium.

In some embodiments, the substrate includes a stack such as a magnetic tunnel junction. In some embodiments, the substrate includes two or more stacks, each of the stacks including layers such as the layers depicted in FIG. 1. The space between stacks may be narrow such that aspect ratios between stacks may be between about 1:1 and about 60:1, or greater than about 1.5:1, or greater than about 4:1, or between about 1.5:1 and 60:1, or between about 1.5:1 and 40:1, or between about 1.5:1 and 20:1, such as about 5:1. In some embodiments, the space between stacks may be referred to as a negative "feature." In some embodiments, each stack may be referred to as a positive "feature." In some embodiments, the substrate provided is patterned with positive features, each positive feature including a stack of films some of which contain chalcogenide material, whereby the positive features are spaced apart on the substrate. The chalcogenide material on each stack of films in the features may be exposed.

A stack may contain non-volatile and ferromagnetic materials such as cobalt (Co), iron (Fe), manganese (Mn), nickel (Ni), platinum (Pt), palladium (Pd), ruthenium (Ru), and combinations thereof (such as CoFe), and may include a dielectric layer such as an magnesium oxide (MgO) layer between two layers of ferromagnetic materials. Some stack materials may include any of the above listed ferromagnetic layers in combination with boron, such as CoFeB.

In operation 230, a barrier layer is deposited by PP-PECVD on the OTS and/or phase change material. In some embodiments, the PP-PECVD barrier layer is deposited on both OTS and phase change material. In some integration operations, such as etching, cleaning, and other operations, only the OTS or the phase change material may be exposed during a single operation, but in some cases, both OTS and phase change material may be exposed simultaneously during a single operation.

An OTS film may have the same elements as a GST film, but with different proportions and additional elements, such as arsenic and silicon. The OTS may be an amorphous film in some embodiments. The GST may be a compound with a specific stoichiometry and may switch between an amorphous material and a crystalline structure.

In various embodiments, the barrier layer is deposited directly on the OTS and/or phase change material without any other layers between the exposed OTS and/or phase change material and the barrier layer.

In various embodiments, the barrier layer is deposited by PP-PECVD directly on an exposed chalcogenide surface of the substrate. In many embodiments, the barrier layer is deposited directly on the exposed chalcogenide surface without any intervening layers between the barrier layer and the exposed chalcogenide surface.

The barrier layer is deposited by PP-PECVD. Further explanation and examples regarding PP-PECVD of barrier layer is described below with respect to FIG. 2B.

In various embodiments, the barrier layer deposited in operation 230 can be as thin as about 5 Å. In some embodiments, the barrier layer deposited in operation 230 is deposited to a thickness between about 5 Å and about 15 Å, or between about 3 Å and about 10 Å. In various embodiments, the PP-PECVD barrier layer is deposited to a thickness as thin as possible for preserving the properties of the barrier layer and to reduce pinch off at the tops of the gaps between features.

The barrier layer deposited in operation 230 may have a conformality of at least about 50%. While the barrier layer deposited in operation 230 is very thin and possibly not very conformal, the barrier layer can still provide a barrier such that subsequent deposition in operation 250 does not cause formation of volatile byproducts with exposed chalcogenide material. In various embodiments, the effectiveness of a barrier is determined using an experiment for testing using x-ray fluorescence (XRF) to determine how much of chalcogenide material has volatilized. The barrier is effective if the elemental loss is low. The elemental loss desired in certain embodiments depends on the element of the chalcogenide material. In some embodiments, the barrier formed using certain disclosed embodiments is capable of achieving an elemental loss of less than about 2%, as compared to, in some cases, an elemental loss of greater than 5% without the PP-PECVD underlayer. In various embodiments, a sidewall landing plug contact clean decoration test performed by using a spin-rinse clean tool is used to visually test for chalcogenide material by transmission electron microscopy (TEM) after cross-sectioning.

Following operation 230, an optional post-treatment may be performed, which may be performed without breaking vacuum, or may be performed in the same chamber, or may be performed in a different chamber. A post-treatment may involve exposure of the deposited barrier layer to an inert gas ignited by a plasma. Example inert gases include nitrogen, ammonia, and noble gases such as helium and argon. In some embodiments, a helium-rich inert gas may be used in particular. For example, in some embodiments, an inert gas mixture including helium and nitrogen may be used. Gases may be selected depending on the type of film to be deposited and the reactants used during the deposition process. The post-treatment gas may include nitrogen only, ammonia only, nitrogen/ammonia mixture, argon only, helium only, argon/helium mixture, and combinations thereof. Other noble gases may also be used. Post-treatment using an inert gas plasma may be performed in the same chamber as, or without breaking vacuum after depositing the barrier layer. That is, in some embodiments, a substrate may be in a process chamber whereby a barrier layer is deposited and, while the substrate is in the same process chamber, the substrate may be exposed to an inert gas plasma for post-treatment. In some embodiments, a substrate may be in a process station of a multi-station chamber, whereby a barrier layer is deposited on the substrate in a first station, the substrate is transferred to a second station without breaking vacuum, and the substrate is exposed to an inert gas plasma in the second station for post-treatment.

In operation 250, a chlorine-free conformal encapsulation layer is deposited over the barrier layer by atomic layer deposition (ALD). In some embodiments, the conformal encapsulation layer is deposited after depositing the barrier layer to form a multi-layer encapsulation layer. Chlorine-free reactants are used during deposition to prevent formation of volatile metal chlorides, given the corrosiveness of chlorine. The PP-PECVD barrier layer is not completely non-porous, but provides sufficient barrier to minimize damage caused by other halides. In various embodiments, the deposition is performed using PEALD. Further embodiments are described below with respect to FIG. 2C. In some embodiments, plasma is optional during deposition of the chlorine-free conformal encapsulation layer. If diiodosilane is used as a silicon-containing precursor during deposition of a chlorine-free conformal encapsulation layer, the plasma may not be optional. Some iodosilane precursors can be deposited without plasma, but in some embodiments further include post-treating the deposited layer to increase density of the deposited layer.

The PEALD encapsulation layer deposited in operation 250 may be deposited to a thickness greater than the thickness of the PP-PECVD encapsulation layer deposited in operation 230. In some embodiments, the PEALD layer is deposited in sufficient cycles to deposit a desired thickness of film. Any suitable number of deposition cycles may be included in a PEALD process to deposit a desired film thickness of silicon nitride. For example, about fifty deposition cycles may be performed to deposit a film on the substrate using disclosed embodiments. In some embodiments the thickness of the deposited silicon nitride film may be greater than about 30 Å on a sidewall over a stack of films for fabrication of a memory device.

The encapsulation layer deposited in operation 250 may have a step coverage of at least about 95%, or about 100%, or 100%. In some embodiments, a substrate having stacks of material including chalcogenide material having an aspect ratio between stacks is about 5:1, and operation 250 may involve depositing silicon nitride to a step coverage of at least about 95% using an iodine-containing precursor and ammonia.

In various embodiments, operations 230 and 250 are performed in a vacuum. Operations 230 and 250 may be performed in the same chamber as, or without breaking vacuum. That is, in some embodiments, a substrate may be in a process chamber whereby a barrier layer is deposited by PP-PECVD and, while the substrate is in the same process chamber, an encapsulation layer is deposited by PEALD. In some embodiments, a substrate may be in a process station of a multi-station chamber, whereby a PP-PECVD barrier layer is deposited on the substrate in a first station, the substrate is transferred to a second station without breaking vacuum, and a PEALD encapsulation layer is deposited on the substrate in the second station.

Figure 2B:
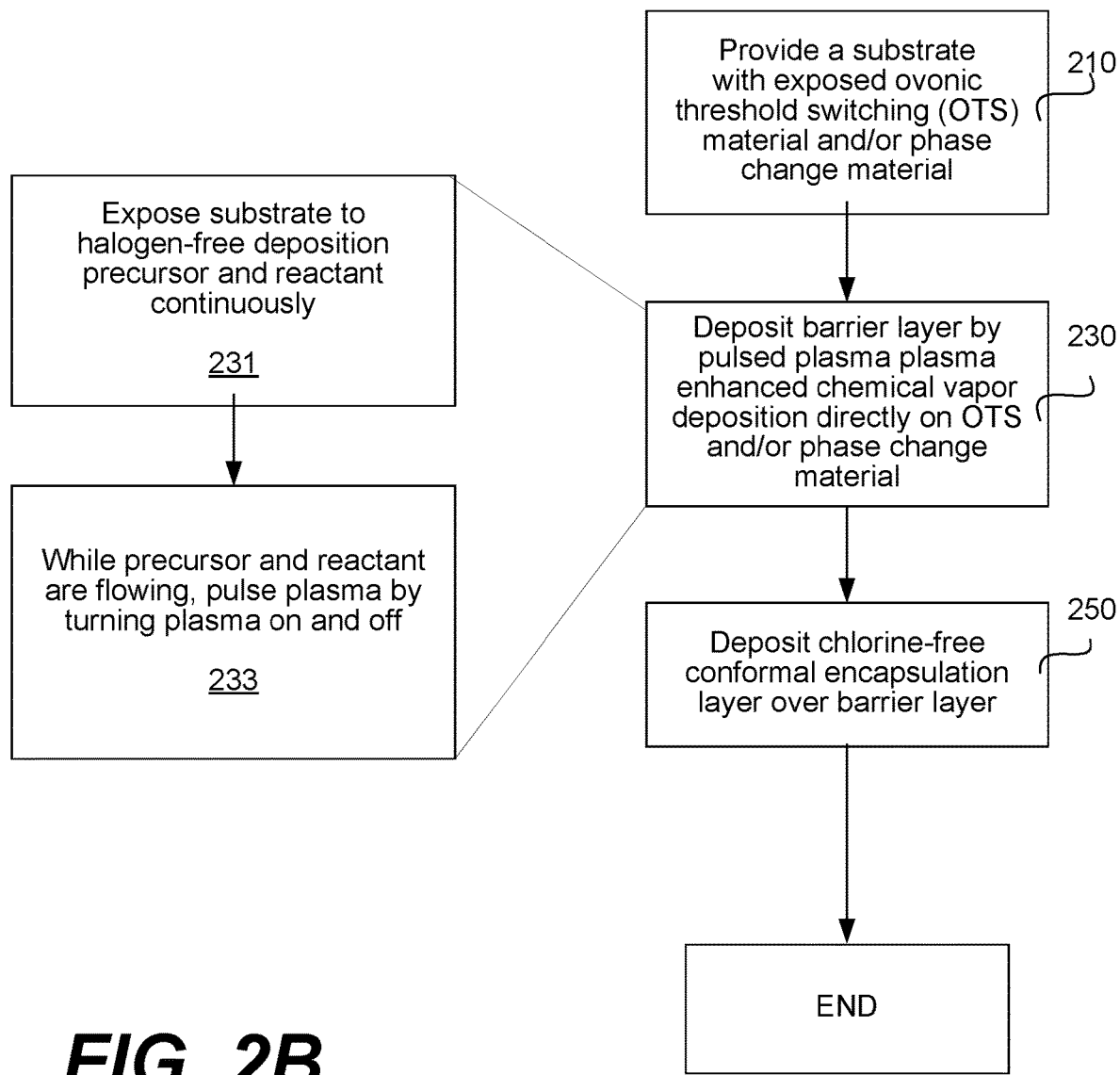

FIG. 2B provides an example for performing operation 230 of FIG. 2A. In operation 231, the substrate is exposed to a deposition precursor and reactant continuously. For example, in various embodiments, while the substrate is heated at a temperature of less than about 300° C., continuous flows of a deposition precursor and a reactant may be flowed to a process chamber housing the substrate.

The encapsulation layer may be deposited using a variety of reactants depending on the type of encapsulation layer to be deposited. For example, deposition of a silicon nitride encapsulation layer may be performed by exposing the substrate to a silicon-containing precursor and a nitrogen-containing reactant.

In many embodiments, the deposition precursor is a silicon-containing precursor. A general silicon-containing precursor used in methods described herein may have the structure:

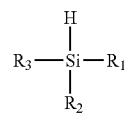

where $R_1$, $R_2$, and $R_3$ may be the same or different substituents, and may include silanes, amines, halides, hydrogen, or organic groups, such as alkylamines, alkoxy, alkyl, alkenyl, alkynyl, and aromatic groups.

In various embodiments, a halogen-free silicon-containing precursor is used. For example, in some embodiments, an aminosilane or disilane can be used. Without being bound by a particular theory, it is believed that exposing some chalcogenide materials to a halogen-containing silicon-containing precursor may form a passivation layer that reduces the ability of the chalcogenide material to function in a memory device.

While various silicon-containing precursors may be used during operation 230, polysilanes ($H_3Si-(SiH_2)_n-SiH_3$) where $n \geq 1$ may yield particularly good results for deposition of a barrier film having sufficient diffusion properties to prevent underlying chalcogenide material from being exposed to deposition chemistry used in subsequent operations. Example polysilanes include such as silane, disilane, trisilane, trisilylamine, and tetrasilane:

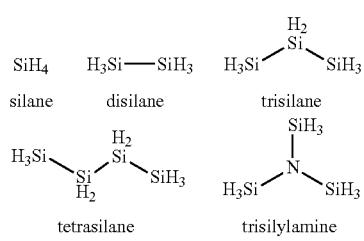

In some embodiments, the silicon-containing precursor is an alkoxysilane. Alkoxysilanes that may be used include, but are not limited to, the following:

$H_x$—Si—$(OR)_y$ where x=1-3, x+y=4 and R is a substituted or unsubstituted alkyl group; and $H_x(RO)_y$—Si—Si—$(OR)_y H_x$ where x=1-2, x+y=3 and R is a substituted or unsubstituted alkyl group.

Examples of silicon-containing precursors include: methylsilane; trimethylsilane (3MS); ethylsilane; butasilanes; pentasilanes; octasilanes; heptasilane; hexasilane; cyclobutasilane; cycloheptasilane; cyclohexasilane; cyclooctasilane; cyclopentasilane; 1,4-dioxa-2,3,5,6-tetrasilacyclohexane; diethoxymethylsilane (DEMS); diethoxysilane (DES); dimethoxymethylsilane; dimethoxysilane (DMOS); methyldiethoxysilane (MDES); methyl-dimethoxysilane (MDMS); octamethoxydodecasiloxane (OMODDS); tert-butoxydi silane; tetramethylcyclo tetrasiloxane (TMCT S); tetraoxymethylcyclotetrasiloxane (TOMCTS); triethoxysilane (TES); triethoxysiloxane (TRIES); and trimethoxysilane (TMS or TriMOS).

In some embodiments, the silicon-containing precursor may be an aminosilane, with hydrogen atoms, such as bisdiethylaminosilane, diisopropylaminosilane, bis(tert-butylamino) silane (BTBAS), or tris(dimethylamino)silane. Aminosilane precursors include, but are not limited to, the following: $H_x$—Si—$(NR)_y$ where x=1-3, x+y=4 and R is an organic or hydride group. In some embodiments, oxygen-containing chlorine-free silicon precursors such as MDES and MDMS may have a risk of incorporating oxygen into the encapsulation layer and potentially forming hydroxyl groups due to the presence of alcohol groups. However, the conditions and reactants may be modulated to prevent formation of hydroxyl groups such as by reducing the flow of oxygen-containing chlorine-free silicon precursors during deposition or by using a mixture of silicon precursors.

In various embodiments, the silicon-containing precursor is flowed at a flow rate between about 10 sccm and about 200 sccm, or between about 20 sccm and about 70 sccm, or between about 40 sccm and about 60 sccm.

The reactant used to react with the silicon-containing precursor depends on the material being deposited. For example, for deposition of silicon nitride, the reactant used is a nitrogen-containing reactant. Example nitrogen-containing reactants include nitrogen gas and ammonia gas. In various embodiments, the nitrogen-containing gas is halogen-free.

The nitrogen-containing reactant is flowed at a flow rate between about 100 sccm and about 300 sccm. In various embodiments, the ratio of silicon-containing precursor to nitrogen-containing reactant is between about 25 sccm and about 300 sccm, or between about 130 sccm and about 170 sccm.

In some embodiments, an inert gas is flowed during operation 231. The ratio of silicon precursor to inert gas may be about 100:1.

In some embodiments, the silicon-containing precursor, the nitrogen-containing reactant, or both gases are diluted when delivered from a process gas source. For example, in some embodiments, the silicon-containing precursor is diluted in hydrogen. In embodiments where hydrogen is used as an inert gas, the ratio of flow rate of silicon precursor to flow rate of hydrogen may be about 5:1. In embodiments where a nitrogen-containing gas or gas mixture is used as an inert gas, the ratio of flow rate of silicon precursor to combined flow rate of nitrogen-containing gas or gas mixture may be between about 500:1. In some embodiments, the nitrogen-containing gas mixture includes nitrogen gas and ammonia gas. In some embodiments, the nitrogen-containing reactant is diluted in hydrogen. The diluent can be any one or more of the following gases: hydrogen, argon, helium, neon, and krypton.

In some embodiments, dilute ammonia may be used to reduce the hydrogen concentration in the plasma during deposition and subsequently hydrogen incorporated into the deposited layer. Additionally, an experiment was conducted comparing the N—H bonding in the film as compared to the total N—H and Si—H bonding in the film versus wet etch rate; the data indicated that a lower wet etch rate is achievable by having a reduced amount of N—H bonding. Another experiment was conducted comparing the stress of films versus the wet etch rate; the results indicated a low wet etch rate can be achieved with high compressive stress films. The combination of these two experiments suggests that a low stress film can reduce wet etch rate, which can be achieve by reducing N—H bonding in the film. The presence of N—H bonding can be modulated by varying the amount of ammonia gas used. The presence of hydrogen in the plasma can cause chalcogenide damage during deposition and the incorporation of hydrogen in the deposited encapsulation layer may result in an undesirable wet etch rate. In one example, the ratio of silane gas flow rate to ammonia gas flow rate may be used to reduce the wet etch rate. For example, in some embodiments, the ratio of silane gas flow rate to ammonia gas flow rate may be about 1:3 for PP-PECVD films, as compared to non-pulsing films which may involve a ratio of about 1:8. Wet etch rate may be used as a metric for determining quality of a film; for example, a low wet etch rate film may have high quality.

In some embodiments, PP-PECVD may involve introducing hydrogen during deposition. Hydrogen contributes to increased conformality but where hydrogen is used, PP-PECVD is performed for a short duration so as not to cause a reaction between hydrogen and the chalcogenide material. For example, pulses may be between about 0.1 and about 10 ms and the overall duration for flowing the process gases and pulsing plasma is less than about 50 seconds.

In operation 233, while the deposition precursor and reactants are flowing, a plasma is ignited and pulsed. In various embodiments, the plasma is pulsed by turning the plasma on and off, that is between 0 W and an "on" state between about 80 W and about 250 W or about 200 W per substrate. In various embodiments, the plasma is pulsed by igniting between two plasma states—a "low power" state being a plasma power between about 125 W and about 250 W or about 45 W per station, and a "high power" state being a plasma power between about 250 W and about 1000 W or about 200 W per station.

Without being bound by a particular theory, it is believed that without plasma, a thermal deposition process using CVD will deposit a silicon nitride film having a low film density of about 2.1 g/cm$^3$ which may be too low to prevent damage to the chalcogenide material when in subsequent deposition using PEALD. Density can be used as a metric for determining the quality of an encapsulation layer. A higher density layer is a more encapsulation layer. For example, in some embodiments, the PP-PECVD layer deposited using certain disclosed embodiments has a density of at least about 2.4 g/cm$^3$. In some embodiments, the PEALD layer deposited using certain disclosed embodiments has a density of at least about 2.75 g/cm$^3$.

In some embodiments, the deposited layer may be further subject to post-treatment, particularly for films deposited without using a plasma. That is, in some embodiments, a thermally deposited layer may be post-treated to increase density and improve encapsulation layer properties. One example post-treatment is treating the thermally deposited film using a low power (such as about 100 W per station) plasma ignited in an environment having helium and nitrogen gas for a duration between about 1 minute and about 8 minutes.

In various embodiments, films are deposited by exposing a substrate to a deposition precursor and a reactant while pulsing plasma in short pulses, such as pulses having a pulse duration between about 0.01 ms to about 5 ms, or between about 0.02 ms and about 5 ms, or between about 0.05 ms and about 5 ms, or between about 0.05 ms and about 1.9 ms, between about 0.5 ms and about 1.9 ms. Plasma is pulsed in various embodiments using a pulsing frequency between about 100 Hz and about 6 Hz.

The plasma may be pulsed at a pulse frequency between about 2 Hz and about 100 kHz with duty cycle ranging from about 1% to about 95% or about 2% to about 20%. In various embodiments, the duty cycle is about 10%. In various embodiments, the duty cycle affects the wet etch rate of the deposited film. A lower wet etch rate results in a lower wet etch rate and higher quality silicon nitride film. An experiment is discussed in further detail below with respect to FIG. 6.

The duty cycle is defined as the duration for which the plasma is on during a period having a duration T. The duration T includes the duration for pulse ON or HIGH time (the duration for which the plasma is in an ON state or in HIGH power state) and the duration for plasma OFF or LOW time (the duration from which the plasma is in an OFF state or in LOW power state) during a given period. The pulse frequency will be understood as 1/T. For example, for a plasma pulsing period T=100 µs, frequency is 1/T=1/100 µs, or 10 kHz. The duty cycle or duty ratio is the fraction or percentage in a period T during which the plasma is in the ON state such that duty cycle or duty ratio is pulse ON time divided by T. For example, for a plasma pulsing period T=100 µs, if a pulse ON time is 70 µs (such that the duration for which the plasma is in an ON state in a period is 70 µs) and a pulse OFF time is 30 µs (such that the duration for which the plasma is in an OFF state in a period is 30 µs), the duty cycle is 70%. In some embodiments, the shortest RF on time during the pulse step can be as low as about 5 µsec. In some embodiments, the shortest RF off time can be about 5 µsec. Depending on the duty cycle and the frequency, various combinations of RF on/RF off pulses can be performed. For example, in some embodiments, this operation may be performed for a duration of about 0.01 ms to about 5 ms, or between about 0.02 ms and about 5 ms, or between about 0.05 ms and about 5 ms, or between about 0.05 ms and about 1.9 ms, between about 0.5 ms and about 1.9 ms. During operation 233, the plasma may be pulsed hundreds to thousands of time depending on total plasma duration time. In some embodiments, a higher duty cycle may reduce conformality as a higher duty cycle results in a deposition process that becomes more like CVD than ALD.

Without being bound by any particular theory, it is believed that pulsing plasma achieves conditions sufficient to form a barrier with at least about 30% or at least about 50% step coverage. The step coverage of the PP-PECVD layer determines the deposited thickness used to get adequate film coverage on the sidewall. For example, if the layer deposited has a low step coverage such as less than about 40%, depositing a thicker film can be used to achieve a sidewall thickness between about 3 Å and about 10 Å to provide sufficient thickness to be an effective barrier. In some embodiments, where the PP-PECVD has a higher step coverage, such as about 50%, the thickness at the tops of the features may be less than 20 Å, providing enough thickness to be an effective barrier but a thin enough thickness to prevent pinch off. The combination of thickness and step coverage may be affected by gap sizes in advanced geometry device gaps as devices shrink. In continuous PECVD, when the plasma is on, ions, radicals, neutral species, and other reactive species are generated in the chamber, the bulk of which may be too reactive and thereby degrade the chalcogenide material and/or react with the chalcogenide material to form a passivation layer or volatile gases.

Without being bound by a particular theory, in PP-PECVD deposition as described herein, it is believed that when the plasma is turned off or in the low state after each pulse, reactive species recombine in the following order: electrons disappear/recombine, ions recombine, and radicals recombine. Since the pulses are extremely short (e.g., plasma is turned on for a short duration, then turned off for a longer duration to allow deposition), when the plasma is turned off, the electrons and ions recombine, eliminating the directionality of the ions in depositing the material. Radicals take a longer time to recombine, so deposition is mainly driven by radicals, rather than ions. Radicals are then able to delve deep into high aspect ratio features (1.5:1-20:1, particularly suitable for applications greater than 4:1) and deposit a film having at least sufficient conformality to act as a barrier between the chalcogenide material and the PEALD encapsulation layer even at the bottom of the features. However, it will be understood that this may not occur in all embodiments.

In various embodiments, during operation 233, the PP-PECVD film deposited is deposited at a deposition rate of about 1.25 Å/second.

Operation 233 may be performed such that plasma is pulsed over a duration between about 5 seconds and about 50 seconds. That is, during the duration of about 5 seconds to about 50 seconds, the plasma is pulsed various times. In some embodiments, operation 233 is performed until the material deposited has a thickness between about 5 Å and about 10 Å. In some embodiments, due to the mass transport limited regime of PP-PECVD, the thickness of the barrier layer on sidewalls of a patterned substrate having exposed chalcogenide material may be between about 5 Å and about 10 Å while the thickness of the barrier layer on the top of the pattern in the field region may be between about 10 Å and about 30 Å or about 15 Å.

In various embodiments, operations 231 and 233 form a barrier layer that has low conformality, such as at least about 50% or about 50%. However, high conformality of the barrier layer may not be desired so long as the barrier layer can function to prevent the underlying chalcogenide material from reacting with other chemistries used in subsequent process.

It was particularly unexpected to find barrier layers having being as thin as about 5 Å to protect the chalcogenide material from reacting with hydrogen gas, other ambient gases, and process gases used in subsequent deposition thereby preserving the underlying OTS or phase change material. The thinness of the barrier layer also does not impact the properties of the encapsulation layer deposited over the barrier layer The barrier layer deposited in operations 231 and 233 form an encapsulation layer having a density of about at least about 2.5 g/cm$^3$.

In some embodiments, as described above, an optional post-treatment may be performed following operation 233. In some embodiments, the post-treatment is performed to densify the PP-PECVD barrier layer. For example, in some embodiments, the density of the barrier layer after PP-PECVD may be less than 2.0 g/cm$^3$. Post-treatment may be performed to densify the PP-PECVD barrier layer to a density between about 2.3 g/cm$^3$ and 2.7 g/cm$^3$.

The density of the PP-PECVD barrier layer deposited in operation 230 is less than the density of the PEALD layer deposited in operation 250. The density of the PP-PECVD barrier layer may be less than about 2.5 g/cm$^3$ while the density of the PEALD silicon nitride layer may be greater than about 2.76 g/cm$^3$. In various embodiments, the optional post-treatment is performed to densify the PP-PECVD barrier layer to increase the density to a density between the density of the PP-PECVD barrier layer without post-treatment and PEALD silicon nitride layer deposited in accordance with operation 250.

That is, in some embodiments, after pulsing the plasma, both flows of the precursor and reactant are turned off and an inert gas may be flowed to the process chamber without a process gas (e.g., without a deposition precursor such as a silicon-containing precursor or a reactant such as a nitrogen-containing reactant) and the plasma is ignited to treat the deposited barrier layer using an inert gas plasma. Post-treatment may be performed for a duration between about 30 seconds and about 60 seconds in some embodiments.

In some embodiments, post-treatment plasma power may be greater than the plasma power used during either of operation 230, operation 250, or both. In some embodiments, post-treatment plasma is performed in a chamber having a chamber pressure less than a chamber pressure used during operation 230.

In some embodiments, post-treatment is performed in a chamber separate from that of operations 230 and 250. In some embodiments, post-treatment is performed between operations 230 and 250 without breaking vacuum. For example, in some embodiments, operation 230 may be performed in a first chamber, post-treatment may be performed in a second chamber, and operation 250 may be performed in a third chamber, where all three chambers are part of the same tool. In some embodiments, the first chamber and third chamber may be the same chamber; that is, after post-treatment in a separate chamber, the substrate may be transferred back to the first chamber to then subsequently perform operation 250. In some embodiments, all three chambers are set at different chamber pressures. The chamber pressure may also depend on the chemistries selected for deposition and post-treatment in each chamber and the desired properties of the encapsulation bilayer.

Figure 2C:
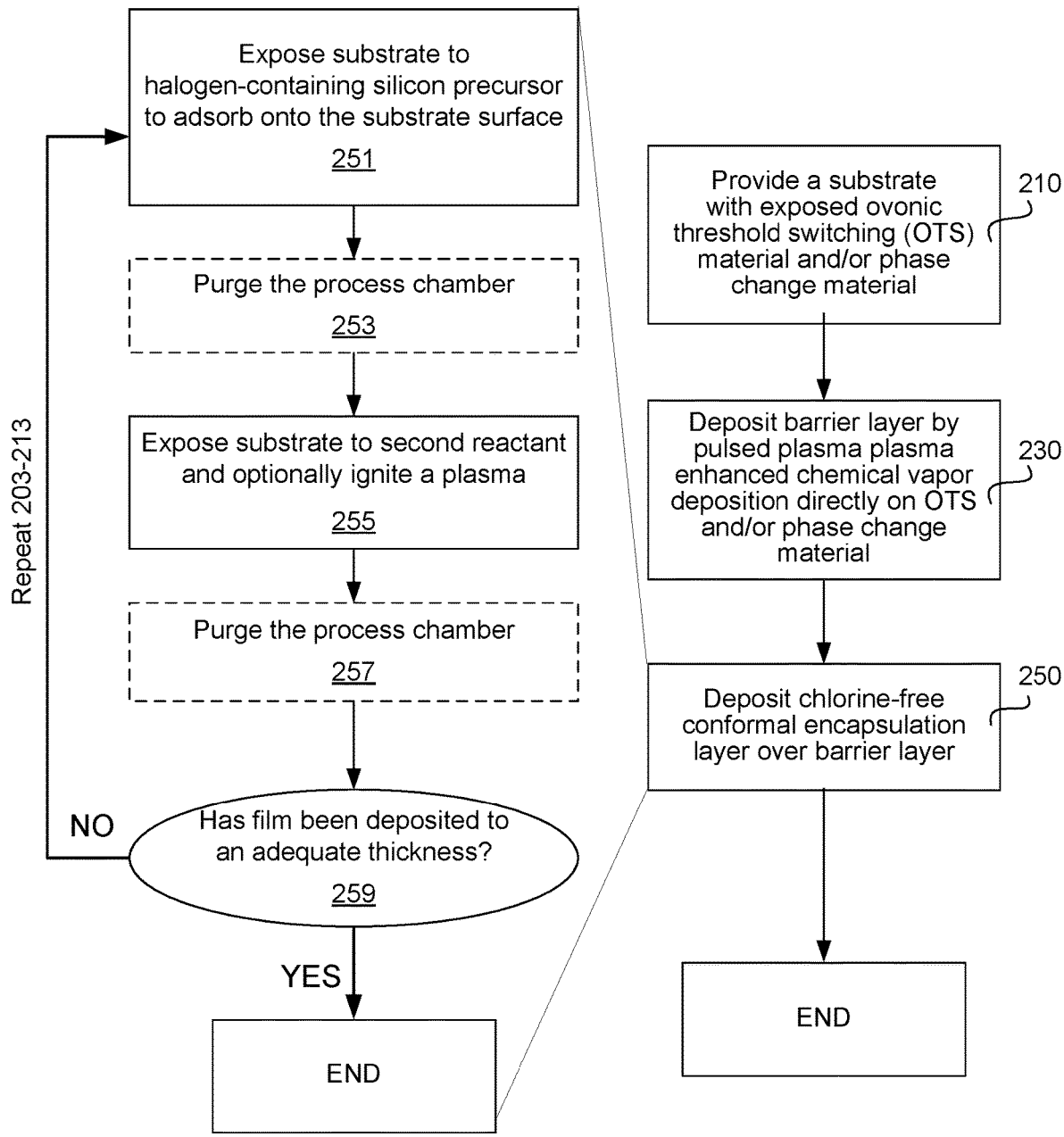

Referring now to FIG. 2C, the operations described with respect to FIG. 2C provide one example of a technique for depositing a chlorine-free conformal encapsulation layer over the barrier layer in operation 250 of FIG. 2A. FIG. 2C may include operations for depositing an encapsulation layer by ALD or PEALD. Prior to FIG. 2C, a barrier layer such as a silicon nitride barrier layer deposited using PP-PECVD is provided on a substrate such that the barrier layer is in direct contact with chalcogenide material on the substrate and the encapsulation deposited in FIG. 2C is deposited directly on the barrier layer without any other intervening layers.

Embodiments described herein involve deposition by ALD. ALD is a technique that deposits thin layers of material using sequential self-limiting reactions. Typically, an ALD cycle includes operations to deliver and adsorb at least one reactant to the substrate surface, and then react the adsorbed reactant with one or more reactants to form at least a partial layer of material. As an example, a silicon nitride deposition cycle may include the following operations: (i) delivery/adsorption of a silicon precursor, (ii) purging of the silicon precursor from the chamber, (iii) delivery of a nitrogen-containing reactant with an optional plasma, and (iv) purging of the nitrogen-containing gas and/or plasma from the chamber.

Unlike a chemical vapor deposition (CVD) technique, ALD processes use surface-mediated deposition reactions to deposit films on a layer-by-layer basis. In one example of an ALD process, a substrate surface that includes a population of surface active sites is exposed to a gas phase distribution of a first precursor, such as a halogen-containing silicon precursor, in a dose provided to a chamber housing a substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of an iodine-containing silicon precursor may include the iodine-containing silicon precursor as well as derivatives of the iodine-containing silicon precursor. After a first precursor dose, the chamber is then evacuated to remove most or all of the first precursor remaining in gas phase so that mostly or only the adsorbed species remain. In some implementations, the chamber may not be fully evacuated. For example, the chamber may be evacuated such that the partial pressure of the first precursor in gas phase is sufficiently low to mitigate a reaction.

A second reactant, such as a nitrogen-containing reactant, is introduced to the chamber so that some of these second reactant molecules react with the first precursor adsorbed on the surface. In some processes, the second precursor reacts immediately with the adsorbed first precursor. In other embodiments, the second reactant reacts only after a source of activation such as a plasma is applied temporally. In some embodiments, a plasma is ignited during the second reactant dose. The chamber may then be evacuated again to remove unbound second reactant molecules. As described above, in some embodiments the chamber may not be completely evacuated. Additional ALD cycles may be used to build film thickness.

In certain embodiments, an ALD first precursor dose partially saturates the substrate surface. In some embodiments, the dose phase of an ALD cycle concludes before the precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587 (now U.S. Pat. No. 9,355,839), filed Oct. 23, 2013, titled "SUB-SATURATED ATOMIC LAYER DEPOSITION AND CONFORMAL FILM DEPOSITION," which is incorporated herein by reference in its entirety.

As described, in some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

Referring back to FIG. 2C, in various embodiments, operations 251-257 constitute one ALD cycle. While FIG. 2C and the below description with respect to FIG. 2C describe deposition of a silicon nitride encapsulation layer by PEALD using an iodine-containing and/or a bromine-containing silicon precursor, it will be understood that in some embodiments, the encapsulation layer deposited in these operations may be deposited using different precursors and reactants, and in some cases may not involve igniting a plasma.

Referring to FIG. 2C, in operation 251, the substrate is exposed to a halogen-containing silicon precursor such that the silicon precursor adsorbs onto the surface of the substrate. In various embodiments, the silicon precursor adsorbs onto the PP-PECVD barrier layer. In some embodiments, the silicon precursor adsorbs onto both the PP-PECVD barrier layer as well as exposed chalcogenide material. However, in some cases, the thickness of the PP-PECVD barrier layer in gaps between stacks of chalcogenide material may be thinner than the thickness of the PP-PECVD barrier layer on field regions at horizontal tops of the stacks of chalcogenide material but the halogen-containing silicon precursor in operation 251 can still adsorb onto exposed surfaces of the PP-PECVD silicon nitride barrier layer.

In various embodiments, the halogen-containing silicon precursor is a chlorine-free halogen-containing silicon precursor. For example, in some embodiments, the precursor is an iodine-containing and/or bromine-containing silicon precursor such that the iodine-containing and/or bromine-containing silicon precursor adsorbs onto the substrate surface. Using an iodine-containing and/or bromine-containing silicon precursor allows for chlorine-free deposition.

In various embodiments, the silicon precursor is hydrogen-free. For example, iodine-containing and/or bromine-containing silicon precursors may be completely substituted with bromine and/or iodine atoms in various embodiments. That is, iodine-containing precursors and/or bromine-containing precursors may have no hydrogen atoms.

The terms "iodine-containing silicon precursor" and "iodosilane precursor" may be used interchangeably herein and both may refer to precursors including at least one silicon and at least one iodine atom.

Using an iodine-containing silicon precursor allows for chlorine-free deposition. Example iodine-containing silicon precursors include diiodosilane (DIS), tetraiodosilane, hexaiododisilane, and others.

In some embodiments, an iodine-containing, or bromine-containing, or iodine-and-bromine-containing silicon-containing precursor is used, but not a chlorine-containing precursor. In some embodiments, a chlorine-free halogen-containing silane may be used such that the silane includes at least one halogen atom. Such a silane may have a chemical formula of $SiX_aH_y$, where $y≥0$ and X is a non-chlorine halogen, and $a+y=4$. For example, diiodosilane ($H_2SiI_2$) may be used in some embodiments.

Example iodine-containing silicon precursors include diiodosilane (DIS), tetraiodosilane, hexaiododisilane, and others. In various embodiments, bromine-containing silicon precursors are fully halogenated. Bromine-containing silicon precursors may have the chemical formula $Si_xBr_yI_z$, where if $x=1$, y is an integer between and including 1 and 4, and $y+z=4$, or where if $x=2$, y is an integer between and including 1 and 6, and $y+z=6$. Example bromine-containing silicon precursors include tetrabromosilane ($SiBr_4$), $SiBr_3I$, $SiBr_2I_2$, $SiBrI_3$, hexabromodisilane ($Si_2Br_6$), $Si_2Br_5I$, $Si_2Br_4I_2$, $Si_2Br_3I_3$, $Si_2Br_2I_4$, $Si_2BrI_5$, and combinations thereof.

In operation 251, the substrate is exposed to the silicon precursor such that the silicon precursor is adsorbed onto the substrate surface which includes the PP-PECVD barrier layer to form an adsorbed layer of the silicon precursor on the PP-PECVD barrier layer. In some embodiments, the silicon precursor is an iodine-containing and/or bromine-containing silicon precursor and the iodine-containing and/or bromine-containing silicon precursor adsorbs onto the substrate surface in a self-limiting manner such that once active sites are occupied by the iodine-containing and/or bromine-containing silicon precursor, little or no additional iodine-containing and/or bromine-containing silicon precursor will be adsorbed on the substrate surface. For example, iodine-containing and/or bromine-containing silicon precursor may be adsorbed onto at least about 60% of the substrate surface. In various embodiments, when the iodine-containing and/or bromine-containing silicon precursor is flowed to the chamber, the iodine-containing and/or bromine-containing silicon precursor adsorbs onto active sites on the surface of the substrate, forming a thin layer of the iodine-containing and/or bromine-containing silicon precursor on the surface.

In various embodiments, this layer may be less than a monolayer, and may have a thickness between about 0.2 Å and about 0.4 Å. Methods provided herein may be performed at a temperature less than about 300° C., such as at about 250° C. In some embodiments, disclosed embodiments are performed at a temperature between about 50° C. and about 300° C., such as at a temperature between about 200° C. and about 275° C. In some embodiments, silicon nitride is deposited at a temperature between about 50° C. and about 300° C. In some embodiments, silicon nitride is deposited at a temperature between about 200° C. and about 275° C.

During exposure to the deposition precursor in operation 251, the PP-PECVD barrier layer protects the chalcogenide material, particularly GST material, from reacting with the precursor, thereby preserving the profile and properties of the chalcogenide GST material. The PP-PECVD layer prevents the chalcogenide material from forming salts with the silicon precursor. For example, where a PP-PECVD barrier layer is not present and an iodine-containing silicon precursor is adsorbed directly onto an exposed surface of chalcogenide material, the chalcogenide may react with the iodine-containing silicon precursor to form an iodine-containing chalcogenide salt, which forms a passivation layer on the surface of the chalcogenide material. While the passivation layer may not redeposit onto the surface to cause damage, it degrades the surface of the chalcogenide material, reducing its function. Likewise, a bromine-containing silicon precursor may also react with the chalcogenide, forming a passivation layer. However, with the presence of the PP-PECVD barrier layer deposited on the chalcogenide material prior to exposure to halogen-containing silicon precursors for conformal deposition by PEALD, the chalcogenide does not react with the silicon precursor and little to no passivation layer is formed, thereby preserving the chalcogenide material. Further, the halogen-containing silicon precursor is capable of adsorbing to the PP-PECVD barrier layer to form a highly conformal encapsulation layer, and even if the PP-PECVD barrier layer has low conformality, the PP-PECVD barrier layer may be very thin (such as about 5 Å) such that variation in thickness of the PP-PECVD barrier layer does not prevent the ultimate encapsulation bilayer from varying in conformality by a substantial amount. For example, a conformality of nearly 100% for PEALD SiN over a 50% conformality PP-PECVD layer deposited only to a thickness of 5 Å still results in a bilayer having over 90% conformality.

In operation 253, the process chamber is optionally purged to remove excess iodine-containing silicon precursor in gas phase that did not adsorb onto the surface of the substrate. Purging the chamber may involve flowing a purge gas or a sweep gas, which may be a carrier gas used in other operations or may be a different gas. In some embodiments, purging may involve evacuating the chamber. Example purge gases include argon, nitrogen, hydrogen, and helium. In some embodiments, operation 253 may include one or more evacuation subphases for evacuating the process chamber. Alternatively, it will be appreciated that operation 523 may be omitted in some embodiments. Operation 253 may have any suitable duration, such as between about 0 seconds and about 60 seconds, for example about 0.01 seconds. In some embodiments, increasing a flow rate of one or more purge gases may decrease the duration of operation 253. For example, a purge gas flow rate may be adjusted according to various reactant thermodynamic characteristics and/or geometric characteristics of the process chamber and/or process chamber plumbing for modifying the duration of operation 251. In one non-limiting example, the duration of a purge phase may be adjusted by modulating purge gas flow rate. This may reduce deposition cycle time, which may improve substrate throughput. After a purge, the iodine-containing and/or bromine-containing silicon precursors remain adsorbed onto the substrate surface.

In operation 255, the substrate is exposed to a second reactant to react with the adsorbed layer of the iodine-containing and/or bromine-containing silicon precursor. Note that the term "second reactant" may be used to describe one or more gases introduced to the chamber when plasma is ignited in an ALD cycle.

In various embodiments, the second reactant is hydrogen-free. For example, in some embodiments, a nitrogen gas ($N_2$) is used as a second reactant, which reacts with the iodine-containing and/or bromine-containing silicon precursor to form a silicon nitride film.

During exposure to the second reactant, the PP-PECVD barrier layer protects the underlying chalcogenide material, particularly GST material, from reacting with the second reactant. In various embodiments, the presence of the PP-PECVD barrier layer prevents the chalcogenide material from reacting with nitrogen plasma, preventing formation of a passivation layer on the chalcogenide surface. The PP-PECVD barrier layer may also prevent damage from ALD byproducts, such as hydrogen iodide.

In some embodiments, ammonia plasma may be used during PEALD if the PP-PECVD layer deposited is sufficiently thick, such as at least about 15 Å, or at least about 20 Å. Likewise, an $N_2/H_2$ plasma may be used following the PP-PECVD deposition to reduce the hydrogen content of the conversion plasma. Alternatively, discrete $N_2$ and $H_2$ plasma exposure operations can be run sequentially (in any order) to better control the sidewall film composition during the ALD cycle. For example, sequential exposures can be used to control particle generation and corrosion by reducing upstream hydrogen iodide formation on wetted surfaces, as reaction byproducts such as hydrogen iodide can attack the chalcogenide material.

In some embodiments, the reaction may be thermal. Methods involving thermal ALD using either ammonia ($NH_3$) or hydrazines (e.g., $H_4N_2$) reduce contamination and reduce the presence of hydrogen radicals during deposition, thereby reducing etching of the chalcogenide and/or metals on the substrate and/or in the chamber. However, the presence of hydrogen in ammonia and hydrazine may cause degradation to the chalcogenide. For a thermal process, deposition may be performed at a temperature of at least about 250° C., such as about 300° C. In some embodiments, disclosed embodiments are performed at a temperature between about 50° C. and about 300° C., such as at a temperature between about 200° C. and about 275° C. In some embodiments, silicon nitride is deposited at a temperature between about 50° C. and about 300° C. In some embodiments, silicon nitride is deposited at a temperature between about 200° C. and about 275° C.

In some embodiments, a plasma may be optionally ignited in operation 255. Plasma energy may be provided to activate the nitrogen-containing gas into ions and radicals and other activated species, which react with the adsorbed layer of the silicon precursor. In disclosed embodiments involving a plasma, the plasma may include less than about 1% hydrogen radicals, thereby reducing etching of chalcogenide or metal material during deposition. In some cases, residual hydrogen from the film surface may form hydrogen radicals, as hydrogen atoms from the film surface may be abstracted by nitrogen plasma to form hydrogen radicals. In some embodiments where a hydrogen-free nitrogen-containing reactant is used, the plasma includes no hydrogen radicals.

In various embodiments, the plasma is an in-situ plasma, such that the plasma is formed directly above the substrate surface in the chamber. The in-situ plasma may be ignited at a power per substrate area between about 0.2122 $W/cm^2$ and about 2.122 $W/cm^2$. For example, the power may range from about 150 W to about 6000 W, or from about 600 W to about 6000 W, or from about 800 W to about 4000 W, for a chamber processing four 300 mm wafers. For example, plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. In various embodiments, a high frequency plasma is used having a frequency of at least about 13.56 MHz, or at least about 27 MHz, or at least about 40 MHz, or at least about 60 MHz. In some embodiments, a microwave-based plasma may be used. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that a second reactant is ignited in a remote plasma generator upstream of the chamber, then delivered to the chamber where the substrate is housed.

Returning to FIG. 2C, in operation 257, the chamber is optionally purged to remove the etched species and any residual byproducts. Operation 225713 may be purged using any of the conditions described above with respect to operation 253.

In operation 259 of FIG. 23, it is determined whether the desired thickness of film has been deposited. If not, operations 251-257 are repeated in sufficient cycles to deposit a desired thickness of film. Any suitable number of deposition cycles may be included in an ALD process to deposit a desired film thickness of silicon nitride. For example, about fifty deposition cycles may be performed to deposit a film on the substrate using disclosed embodiments. In some embodiments the thickness of the deposited silicon nitride film may be greater than about 30 Å on a sidewall over a stack of films for fabrication of a memory device.

In various embodiments, the PEALD silicon nitride encapsulation layer has a density greater than that of the PP-PECVD barrier layer. In some embodiments, the PEALD silicon nitride encapsulation layer deposited in operations 251-259 has a density of at least about 2.75 g/cm$^3$.

The bilayer including both the PP-PECVD and PEALD films as an encapsulation layer has superior properties compared to each of the PP-PECVD and PEALD films alone. For example, the PP-PECVD barrier layer alone may be insufficient to provide conformality to provide a hermetic encapsulation layer over OTS or GST chalcogenide material. Further, a PEALD encapsulation layer alone deposited using a halogen-containing silicon precursor and a nitrogen-containing reactant that may both be hydrogen-free may still cause formation of a passivation layer on the surface of the chalcogenide material due to the halogen-containing silicon precursor reacting with the chalcogenide material. However, with the PP-PECVD barrier layer underlying the PEALD encapsulation layer, the PP-PECVD barrier layer provides sufficient barrier between the chalcogenide material and the halogen-containing silicon precursor to prevent the halogen-containing silicon precursor from reacting with the chalcogenide material, and the PEALD encapsulation layer deposited over the PP-PECVD provides sufficient hermeticity, high conformality, and low hydrogen content. The bilayer approach described herein involves PP-PECVD barrier layer deposited directly on chalcogenide material prior to exposure to a halogen-containing silicon precursor. That is, in various embodiments, the PP-PECVD barrier layer is deposited using a halogen-free silicon precursor such as silane or disilane.

Figure 3:
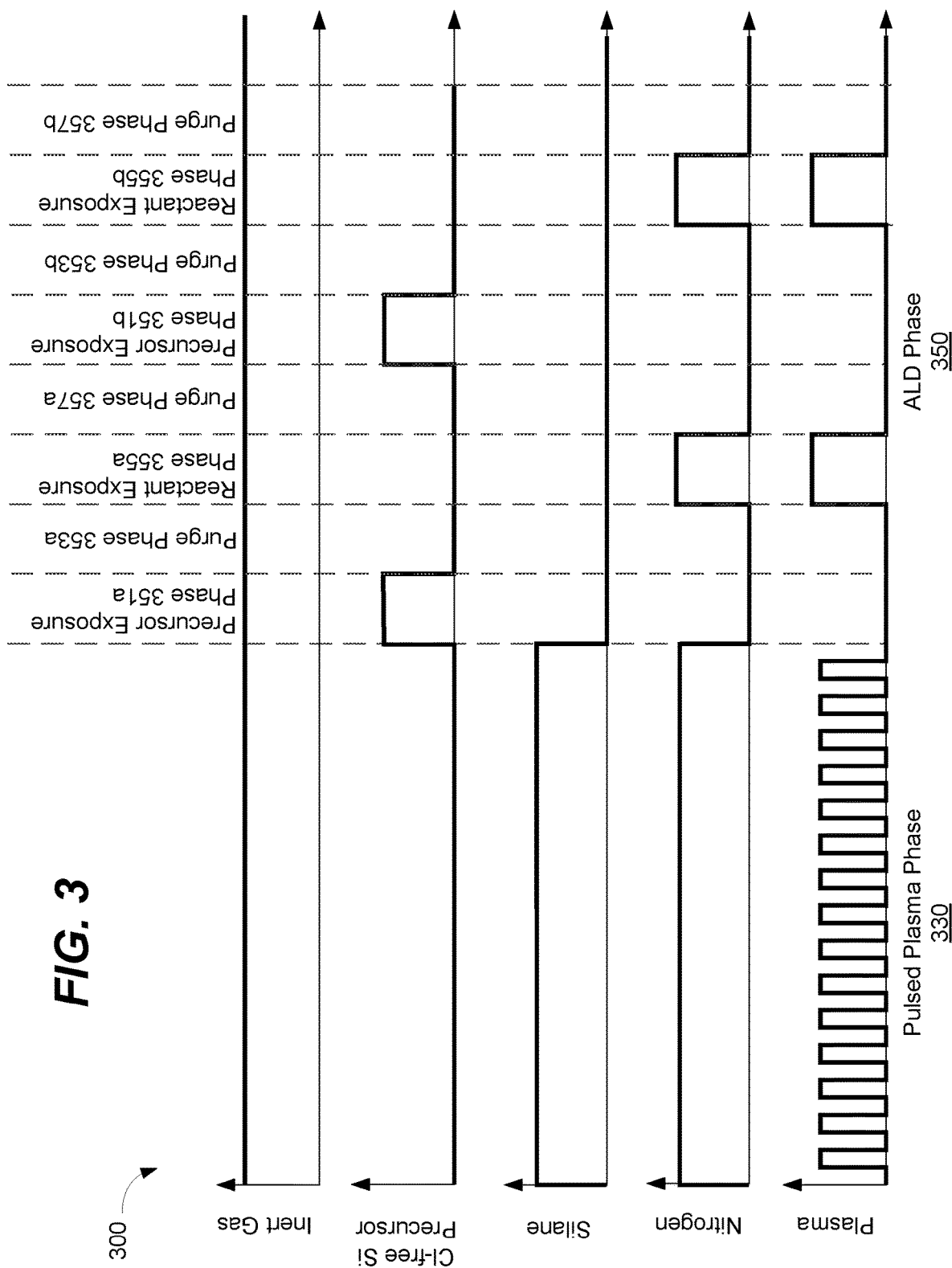
FIG. 3 is a timing sequence diagram showing an example of cycles in a method in accordance with certain disclosed embodiments.

FIG. 3 is an example timing sequence diagram showing an example of a method in accordance with certain disclosed embodiments. Process 300 includes a pulsed plasma phase 330 and an ALD phase 350. Pulsed plasma phase 330 may correspond to operation 230 of FIG. 2A, or operations 231 and 233 of FIG. 2B. ALD phase 350 may correspond to operation 250 of FIG. 2B, or operations 251-257 of FIG. 2C. In this example process 300, two ALD cycles are depicted and are further described in detail below. In this particular example, a silicon nitride PP-PECVD barrier layer is deposited in the pulsed plasma phase 330 using silane and nitrogen gas as the nitrogen reactant, which is also used in the ALD phase. A silicon nitride PEALD encapsulation layer is deposited in ALD phase 350 using two cycles of ALD after the silicon nitride PP-PECVD barrier layer is deposited in pulsed plasma phase 330, and the silicon nitride PEALD encapsulation layer is deposited using a chlorine-free silicon precursor such as diiodosilane and nitrogen gas.

An inert gas may be flowed during the entirety of process 300. It will be understood that in some embodiments, the inert gas also acts as a purge gas. Example inert gases include argon, helium, and krypton. A non-hydrogen inert gas may be used to prevent reaction between hydrogen and a chalcogenide material. Additionally it will be understood that while the same inert gas described herein is used both as an inert gas and a purge gas, in some embodiments these gases may have different composition. Further, in some embodiments, the inert gas is used as a carrier gas to deliver one or more process gases to the process chamber.

In pulsed plasma phase 330, which may correspond to operation 230 of FIG. 2B, an inert gas is flowed, the chlorine-free silicon precursor flow is off, the silane reactant is flowed, and the nitrogen reactant is also flowed. A plasma is ignited between ON and OFF phases multiple times as shown in pulsed plasma phase 330. The pulsing of the plasma may correspond to operation 233 of FIG. 2B.

ALD phase 350 includes two ALD cycles. A first ALD cycle includes precursor exposure phase 351a, which may correspond to operation 251 of FIG. 2C. During precursor exposure phase 351a, an inert gas is flowed, the chlorine-free silicon precursor is flowed, the silane reactant is turned off, and the nitrogen reactant is also turned off. The plasma power is off and no plasma is ignited.

In purge phase 353a, which may correspond to operation 253 of FIG. 2C, an inert gas is flowed while chlorine-free silicon precursor, silane reactant, and nitrogen reactant flows are all off and the plasma is also turned off.

In reactant exposure phase 355a, which may correspond to operation 255 of FIG. 2C, the inert gas is flowed while the chlorine-free silicon precursor and silane reactant flows are turned off, but the nitrogen reactant flow is on and a plasma is ignited.

In purge phase 357a, which may correspond to operation 257 of FIG. 2C, the inert gas is flowed while chlorine-free silicon precursor, silane, and nitrogen flows are off, and the plasma is turned off.

In this example, the film is not deposited to a sufficient thickness as evaluated in operation 259 of FIG. 2C, and the ALD cycle is repeated. The second cycle of ALD includes precursor exposure phase 351b, purge phase 353b, reactant exposure phase 355b, and purge phase 357b.

In precursor exposure phase 351b, which may correspond to operation 251 of FIG. 2C, an inert gas is flowed and the chlorine-free silicon precursor is flowed, while the silane flow and nitrogen flows are turned off. A plasma is turned off during this phase.

In purge phase 353b, which may correspond to a repeated operation 253 of FIG. 2C, an inert gas is flowed while the chlorine-free silicon precursor, silane, and nitrogen gas flows are off. No plasma is ignited during this phase.

In reactant exposure phase 355b, which may correspond to a repeated operation 255 of FIG. 2C, an inert gas is flowed while chlorine-free silicon precursor and silane gas flows are off. Nitrogen gas flow is turned on and the plasma is turned on during this phase.

In purge phase 357b, which may correspond to a repeated operation 257 of FIG. 2C, an inert gas is flowed while the chlorine-free silicon precursor, silane, and nitrogen gas flows are off. No plasma is ignited during this phase.

Although two ALD cycles are depicted in ALD phase 350, it will be understood that in various embodiments, more than two cycles may be used to deposit an encapsulation layer to form an encapsulation layer have certain desired properties, such as thickness, conformality, density, and hermeticity.

Apparatus

Figure 4:
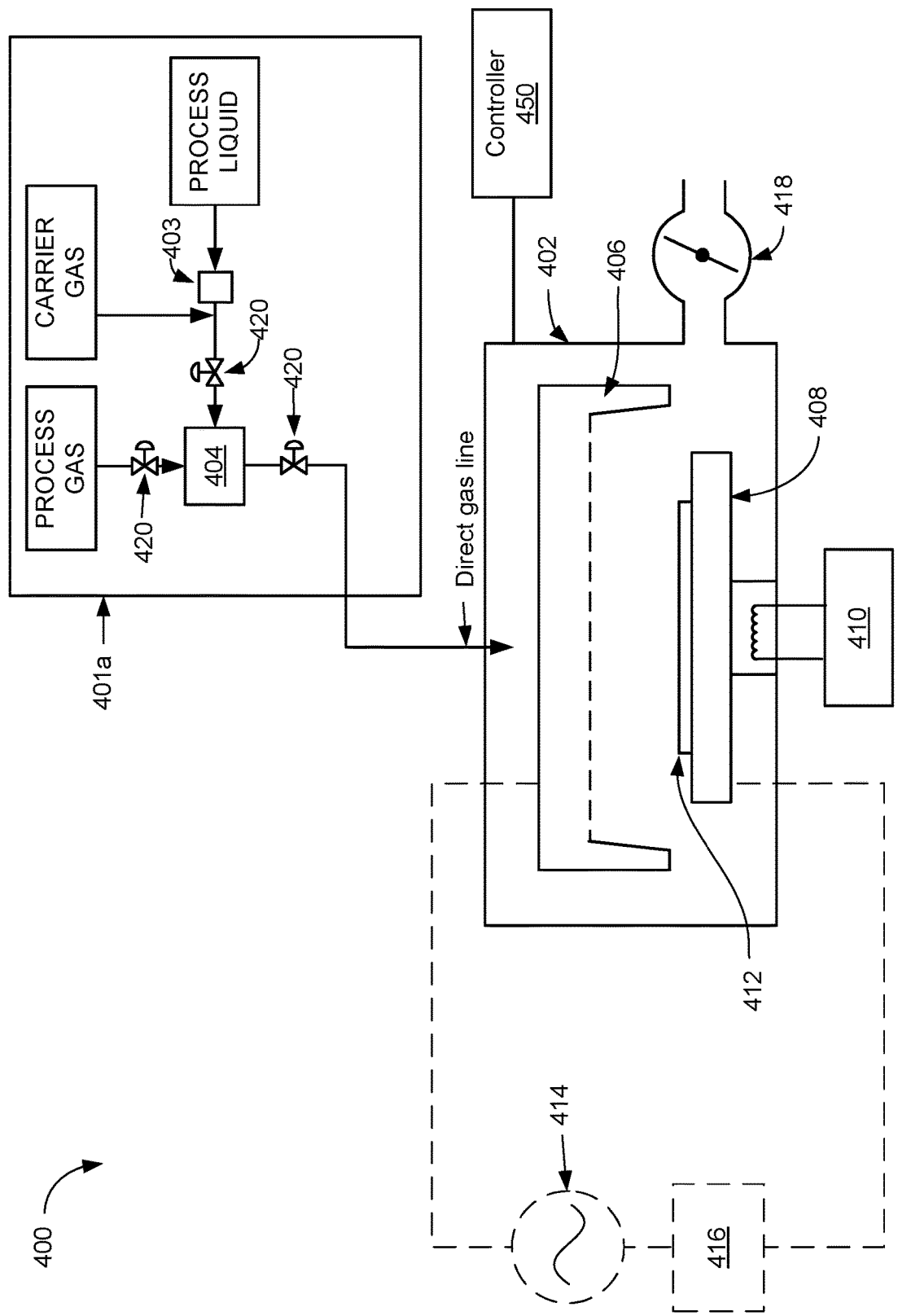
FIG. 4 is a schematic diagram of an example process chamber for performing disclosed embodiments.
Figure 5:
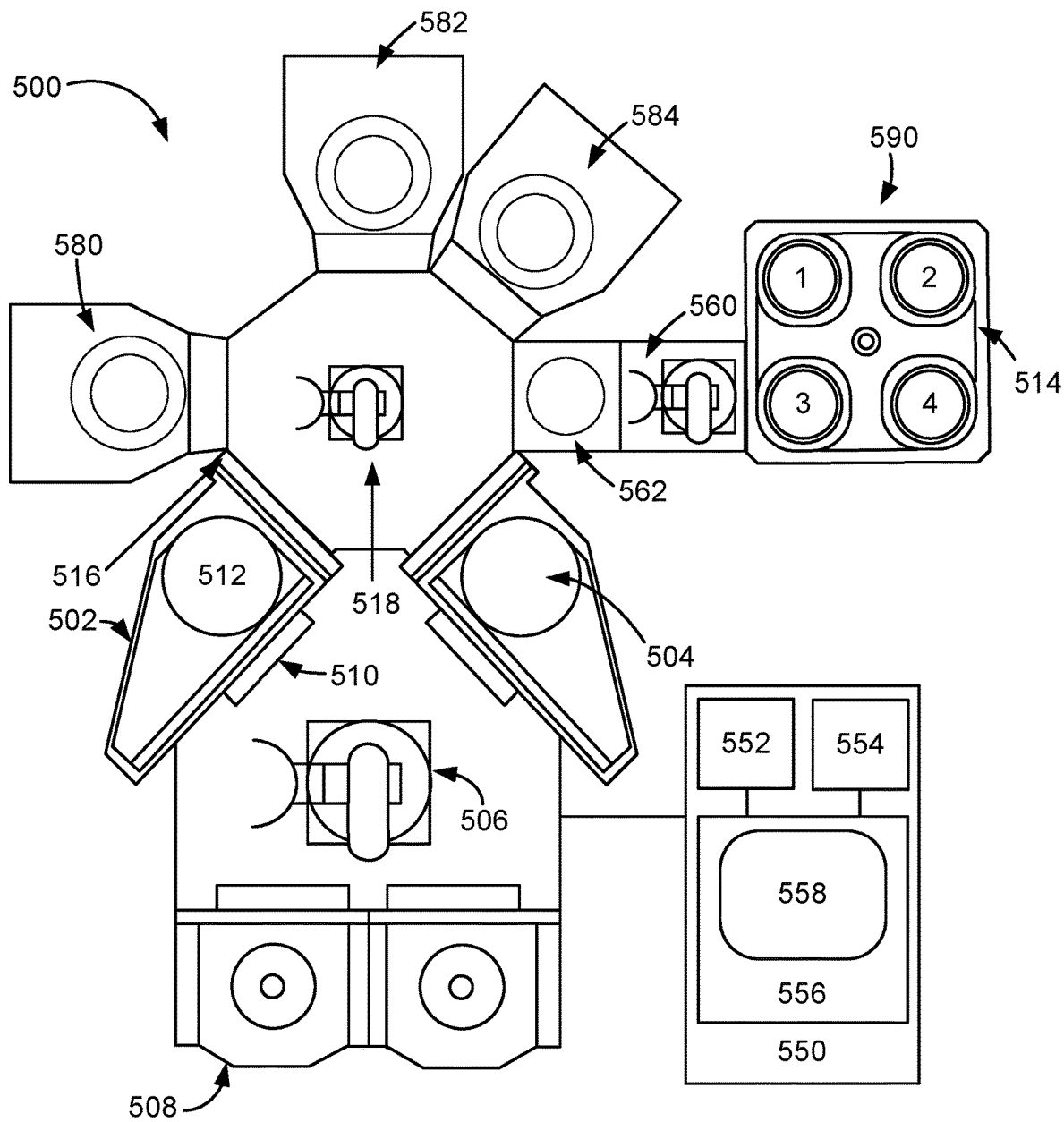
FIG. 5 is a schematic diagram of an example process tool for performing disclosed embodiments.

FIG. 4 depicts a schematic illustration of an embodiment of an atomic layer deposition (ALD) process station 400 having a process chamber body 402 for maintaining a low-pressure environment. A plurality of ALD process stations 400 may be included in a common low pressure process tool environment. For example, FIG. 5 depicts an embodiment of a multi-station processing tool 500. In some embodiments, one or more hardware parameters of ALD process station 400 including those discussed in detail below may be adjusted programmatically by one or more computer controllers 450. For examples, one or more computer controllers 450 may be programmed to perform PP-PECVD, PEALD, or both, in accordance to certain disclosed embodiments.

ALD process station 400 fluidly communicates with reactant delivery system 401a for delivering process gases to a distribution showerhead 406. Reactant delivery system 401a includes a mixing vessel 404 for blending and/or conditioning process gases, such as halogen-free silicon precursors such as silane, halogen-containing silicon precursors such as an iodine-containing and/or bromine-containing silicon gases, nitrogen gas, nitrogen-containing gases, hydrogen gas, or other process gases, for delivery to showerhead 406. One or more mixing vessel inlet valves 420 may control introduction of process gases to mixing vessel 404. Nitrogen plasma, or hydrogen plasma in some embodiments such as for deposition by PP-PECVD, may also be delivered to the showerhead 406 or may be generated in the ALD process station 400.

As an example, the embodiment of FIG. 4 includes a vaporization point 403 for vaporizing liquid reactant to be supplied to the mixing vessel 404. In some embodiments, vaporization point 403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller (LFC) upstream of vaporization point 403 may be provided for controlling a mass flow of liquid for vaporization and delivery to process station 400. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 406 distributes process gases toward substrate 412. In the embodiment shown in FIG. 4, the substrate 412 is located beneath showerhead 406 and is shown resting on a pedestal 408. Showerhead 406 may have any suitable shape, and may have any suitable number and arrangement of ports for distributing process gases to substrate 412.

In some embodiments, pedestal 408 may be raised or lowered to expose substrate 412 to a volume between the substrate 412 and the showerhead 406. It will be appreciated that, in some embodiments, pedestal height may be adjusted programmatically by a suitable computer controller 450.

In another scenario, adjusting a height of pedestal 408 may allow a plasma density to be varied during plasma activation cycles in the process in embodiments where a plasma is ignited. At the conclusion of the process phase, pedestal 408 may be lowered during another substrate transfer phase to allow removal of substrate 412 from pedestal 408.

In some embodiments, pedestal 408 may be temperature controlled via heater 410. In some embodiments, the pedestal 408 may be heated to a temperature of at least about 250° C., or in some embodiments, less than about 300° C., such as about 250° C., during deposition of bilayer silicon nitride films as described in disclosed embodiments. In some embodiments, the pedestal is set at a temperature between about 50° C. and about 300° C., such as at a temperature between about 200° C. and about 275° C. In some embodiments, the pedestal is set at a temperature between about 50° C. and about 300° C. In some embodiments, the pedestal is set at a temperature between about 200° C. and about 275° C.

Further, in some embodiments, pressure control for process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to the process station 400.

In some embodiments, a position of showerhead 406 may be adjusted relative to pedestal 408 to vary a volume between the substrate 412 and the showerhead 406. Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more suitable computer controllers 450.

In some embodiments where plasma may be used as discussed above, showerhead 406 and pedestal 408 electrically communicate with a radio frequency (RF) power supply 414 and matching network 416 for powering a plasma. In some embodiments, the plasma energy may be controlled by controlling one or more of a process station pressure, a gas concentration, an RF source power, an RF source frequency, and a plasma power pulse timing. For example, RF power supply 414 and matching network 416 may be operated at any suitable power to form a plasma having a desired composition of plasma species. Examples of suitable powers are included above. Likewise, RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, one recipe chase may include instructions for setting a flow rate of an inert and/or a first reactant gas (e.g., a chlorine-free silane), instructions for setting a flow rate of a carrier gas (such as argon), instructions for setting a flow rate of a second reactant gas (e.g., nitrogen or hydrogen), and instructions for pulsing a plasma.

In another example, a first recipe phase may include instructions for setting a flow rate of an inert and/or a reactant gas (e.g., the first precursor such as an iodine-containing and/or bromine-containing silicon precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas such as nitrogen, instructions for igniting a plasma during the third recipe phase, instructions for modulating the flow rate of a carrier or purge gas, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. It will be appreciated that these recipe phases may be further subdivided and/or iterated in any suitable way within the scope of the disclosed embodiments. In some embodiments, the controller 450 may include any of the features described below with respect to system controller 550 of FIG. 5.

As described above, one or more process stations may be included in a multi-station processing tool. FIG. 5 shows a schematic view of an embodiment of a multi-station processing tool 500 with an inbound load lock 502 and an outbound load lock 504, either or both of which may include a remote plasma source. A robot 506 at atmospheric pressure is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 includes a remote plasma source, the wafer may be exposed to a remote plasma treatment in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot 518 places the wafer into one of the processing stations 580, 582, 584, or loading station to processing station 590 for processing. While the embodiment depicted in FIG. 5 includes load locks, it will be appreciated that, in some embodiments, direct entry of a wafer into a process station may be provided.

The depicted processing chamber 514 includes four process stations, 580, 582, 584, and 590. Station 590 may be a removable module and may be suitable for processing more than one substrate at a time. In this example, station 590 includes four substations, numbered from 1 to 4 in the embodiment shown in FIG. 5.

Each station (580, 582, 584, and each of 1, 2, 3, and 4) may have a heated pedestal, and gas line inlets. It will be appreciated that in some embodiments, each process station may have different or multiple purposes. For example, in some embodiments, process station 580 may be used for etching the substrate, process station 582 may be used for cleaning the substrate, and process station 584 may be used to perform PP-PECVD. Process station 590 may be used to perform PEALD. Process stations may be switchable between a PP-PECVD, an ALD, and plasma-enhanced ALD process modes. Additionally or alternatively, in some embodiments, processing chamber 514 may include one or more matched pairs of ALD and plasma-enhanced ALD process stations. While the depicted processing station 590 includes four substations, it will be understood that a processing chamber according to the present disclosure may have any suitable number of substations. Additionally, while the multi-station processing tool 500 includes four stations (580, 582, 584, 590) it will be understood that in some embodiments, an apparatus may include more than or less than four stations as each station may be a removable or modifiable module. For example, in some embodiments, a processing chamber may have five or more stations, while in other embodiments a processing chamber may have three or fewer stations.

FIG. 5 depicts an embodiment of a wafer handling system 518 for transferring wafers within multi-station processing tool 500. In some embodiments, wafer handling system may transfer wafers between various process stations and/or between a process station and a load lock. Additionally, process station 590 may include a separate wafer handling system 560 used for moving a wafer from another loading station 562 to process station 590. It will be appreciated that any suitable wafer handling system may be employed. Non-limiting examples include wafer carousels and wafer handling robots.

In various embodiments, integration of various stations may address footprint reduction concerns, and toggling of the ability to transfer wafers into different processing modules that operate at different pressures. In some embodiments, custom mini-transfer stations may be present between the main tool and the process modules that cycle pressure up and down quickly.

FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog, and/or digital input/output connections, stepper motor controller boards, etc.

In some embodiments, system controller 550 controls all of the activities of process apparatus 500. System controller 550 executes system control software 558 stored in mass storage device 554, loaded into memory device 556, and executed on processor 552. Alternatively, the control logic may be hard coded in the controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 500. System control software 558 may be configured in any suitable way. For example, various process tool component subroutines or control objects may be written to control operation of the process tool components used to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition (e.g., iodine-containing silicon precursor gases, and nitrogen-containing gases, carrier gases and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above-described deposition processes. The program instructions may control a variety of process parameters, such as DC power level, RF bias power level, pressure, temperature, etc. The instructions may control the parameters to operate in-situ deposition of encapsulation bilayer according to various embodiments described herein.

The system controller 550 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 550.

In some implementations, the system controller 550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 550, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 550 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 550, in some implementations, may be a part of or coupled to a computer that is integrated with, coupled to the system, otherwise networked to the system, or a combination thereof. For example, the system controller 550 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 550 receives instructions in the form of data, which specify parameters for each of the processing steps to be performed during one or more operations. It should be understood that the parameters may be specific to the type of process to be performed and the type of tool that the system controller 550 is configured to interface with or control. Thus as described above, the system controller 550 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 550 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

Stacks of phase change material on a substrate were exposed to alternating pulses of diiodosilane and nitrogen plasma for 60 seconds to deposit 40 Å of silicon nitride after etch and cleaning. Overall conformality of the material over this patterned substrate was observed, with deposition at the bottoms between the stacks having a thickness of about 37.2 Å and deposition at the tops of the features having a thickness of about 24.8 Å. Some phase change material damage was observed in a TEM image of the film.

Stacks of phase change material on a substrate after etch and cleaning were exposed to silane gas and nitrogen gas while pulsing plasma between ON and OFF phases for a duration to deposit 25 Å of silicon nitride, resulting in about 5-7 Å of deposition on the phase change material with about 12-15 Å of deposition at tops of features. This substrate was then exposed to alternating of diiodosilane and nitrogen plasma for 60 seconds to deposit 40 Å of silicon nitride. The resulting substrate resulted in no damage to the phase change material as observed by TEM images.

Experiment 2

Figure 6:
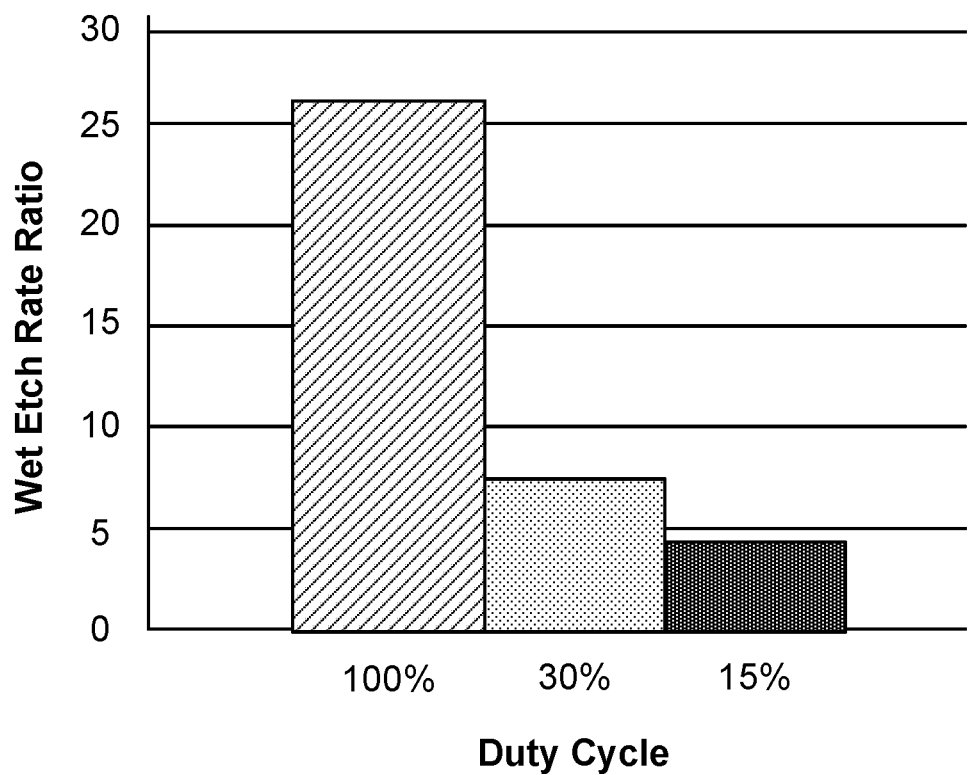
FIG. 6 is a graph depicting wet etch rate ratios of silicon nitride films deposited with varying duty cycles in an experiment conducted in accordance with certain disclosed embodiments.

An experiment was conducted on three different duty cycles of pulsed plasma PECVD silicon nitride films. Wet etch rate was evaluated in dilute hydrofluoric acid. The first silicon nitride film was deposited with 100% duty cycle (continuous plasma on, not pulsed), which resulted in a wet etch rate ratio compared to silicon oxide of 26.2. In comparison, the second film, which was deposited with 30% duty cycle pulses, resulted in a wet etch rate ratio of about 5.3, and the third film, which was deposited with 15% duty cycle pulses, resulted in a wet etch rate ratio of about 4.3. Such results are shown in FIG. 6. These results indicate a dramatic improvement for reducing wet etch rate using PP-PECVD as compared to high wet etch rate silicon nitride films deposited without pulsing. Experimental results showed that wet etch rate reduction is duty cycle and film dependent.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein. Additionally, ranges recited herein are understood to be inclusive of the end values of the ranges in some embodiments.

What is claimed is:

1. An apparatus for processing a semiconductor substrate, the apparatus comprising:
    an etch chamber configured to etch the semiconductor substrate having one or more layers of chalcogenide materials to form a pattern of chalcogenide materials in stacks on the semiconductor substrate;
    a deposition chamber configured to deposit an encapsulation bilayer on the semiconductor substrate;
    a wafer transfer tool configured to transfer the semiconductor substrate between the etch chamber and the deposition chamber without breaking vacuum; and
    a controller configured with instructions to perform the following operations:
        etching, in the etch chamber, the semiconductor substrate having the one or more layers of chalcogenide material to form the pattern of chalcogenide materials; and
        depositing, in the deposition chamber, the encapsulation layer on the semiconductor substrate using one or both of a pulsed-plasma plasma-enhanced chemical vapor deposition (PP-PECVD) process and a plasma-enhanced atomic layer deposition (PEALD) process, wherein the etching and deposition occur without breaking vacuum.

2. The apparatus of claim 1, wherein the controller configured with instructions for depositing the encapsulation bilayer comprises: depositing a first silicon nitride layer on the pattern of chalcogenide materials in the deposition chamber by PP-PECVD; and depositing a second silicon nitride layer on the first silicon nitride layer in the deposition chamber by PEALD.

3. The apparatus of claim 2, wherein the second silicon nitride layer deposited by PEALD is deposited using alternating pulses of a chlorine-free halogen-containing silicon-containing precursor and a nitrogen-containing reactant.

4. The apparatus of claim 3, wherein the nitrogen-containing reactant is hydrogen-free and the chlorine-free halogen-containing silicon-containing precursor comprises iodine, bromine, or combinations thereof.

5. The apparatus of claim 2, wherein the first silicon nitride layer deposited by PP-PECVD is deposited using a halogen-free silane precursor and ammonia.

6. The apparatus of claim 2, wherein the first silicon nitride layer has a thickness between 5 Å and 10 Å on a sidewall of the pattern of chalcogenide materials.

7. The apparatus of claim 2, wherein the first silicon nitride layer deposited by PP-PECVD pulsed at a duty cycle between 5% and 20%.

8. The apparatus of claim 2, wherein the controller configured with instructions for depositing the encapsulation layer is further configured with instructions for:
    exposing the first silicon nitride layer to a post-treatment plasma to densify the first silicon nitride layer.

9. The apparatus of claim 8, further comprising:
    a post-treatment chamber configured to perform the post-treatment plasma to densify the first silicon nitride layer, wherein etching, depositing, and exposing the first silicon nitride layer to the post-treatment plasma occur without breaking vacuum.

10. The apparatus of claim 1, wherein the controller configured with instructions for depositing the encapsulation bilayer comprises: depositing a first silicon nitride layer having a first film density on the pattern of chalcogenide materials in the deposition chamber; and
    depositing a second silicon nitride layer having a second film density on the first silicon nitride layer, wherein the first film density is less than the second film density.

11. The apparatus of claim 10, wherein the first silicon nitride layer is deposited by PP-PECVD in the deposition chamber and the second silicon nitride layer is deposited by PEALD in the deposition chamber.

12. The apparatus of claim 10, wherein the first film density is less than 2.5 g/cm$^3$ and the second film density is greater than 2.6 g/cm$^3$.

13. The apparatus of claim 1, further comprising:
    a clean chamber configured to clean the semiconductor substrate.

14. The apparatus of claim 1, further comprising:
    a mini-transfer station positioned between the etch chamber and the deposition chamber.

15. The apparatus of claim 1, wherein the etch chamber is configured to be at a different pressure than a pressure of the deposition chamber.

* * * * *